(12) United States Patent
Ogura

(10) Patent No.: US 6,414,862 B1
(45) Date of Patent: Jul. 2, 2002

(54) BOOSTING CIRCUIT HAVING A DETECTING PORTION FOR DETECTING THE VALUE OF A POWER SUPPLY VOLTAGE

(75) Inventor: Taku Ogura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/703,721

(22) Filed: Nov. 2, 2000

(30) Foreign Application Priority Data

Mar. 29, 2000 (JP) ........................................ 2000-090512

(51) Int. Cl.[7] .............................................. H02M 3/18
(52) U.S. Cl. ........................................................ 363/60
(58) Field of Search .................... 363/59, 60; 327/530, 327/534, 536; 307/110

(56) References Cited

U.S. PATENT DOCUMENTS

| 4,583,157 A | * | 4/1986 | Kirsch et al. | .................. 363/60 |
| 5,394,077 A | * | 2/1995 | Atsumi | ........................ 323/223 |
| 5,805,435 A | * | 9/1998 | Pascucci | ...................... 363/59 |
| 6,169,444 B1 | * | 1/2000 | Thurber, Jr. | ................. 327/536 |
| 6,122,185 A | * | 9/2000 | Utsunomiya et al. | ......... 363/60 |

FOREIGN PATENT DOCUMENTS

JP        9-082095        3/1997

* cited by examiner

Primary Examiner—Adolf Deneke Berhane
(74) Attorney, Agent, or Firm—Oblon, Spivak, McClelland, Maier & Neustadt, P.C.

(57) ABSTRACT

An object is to provide a word line boosting circuit which, regardless of varying value of the power-supply voltage, can generate a boosted voltage within a range between upper and lower limit values of threshold voltage distribution of semiconductor non-volatile memory elements. A drain boosting circuit (VCa) has a plurality of series-connected boosting stages and the number of parallel-connected capacitors is varied in each stage depending on the value of the power-supply voltage (Vcc). Comparators (OP1) to (OP3) detect resistor-divided voltage values to detect the power-supply voltage (Vcc). A decoder (DCa) generates operation signals (S1a) to (S3a) in accordance with the combination of outputs of the comparators (OP1) to (OP3), thus determining which capacitors should be connected in parallel.

18 Claims, 28 Drawing Sheets

F I G. 1 3
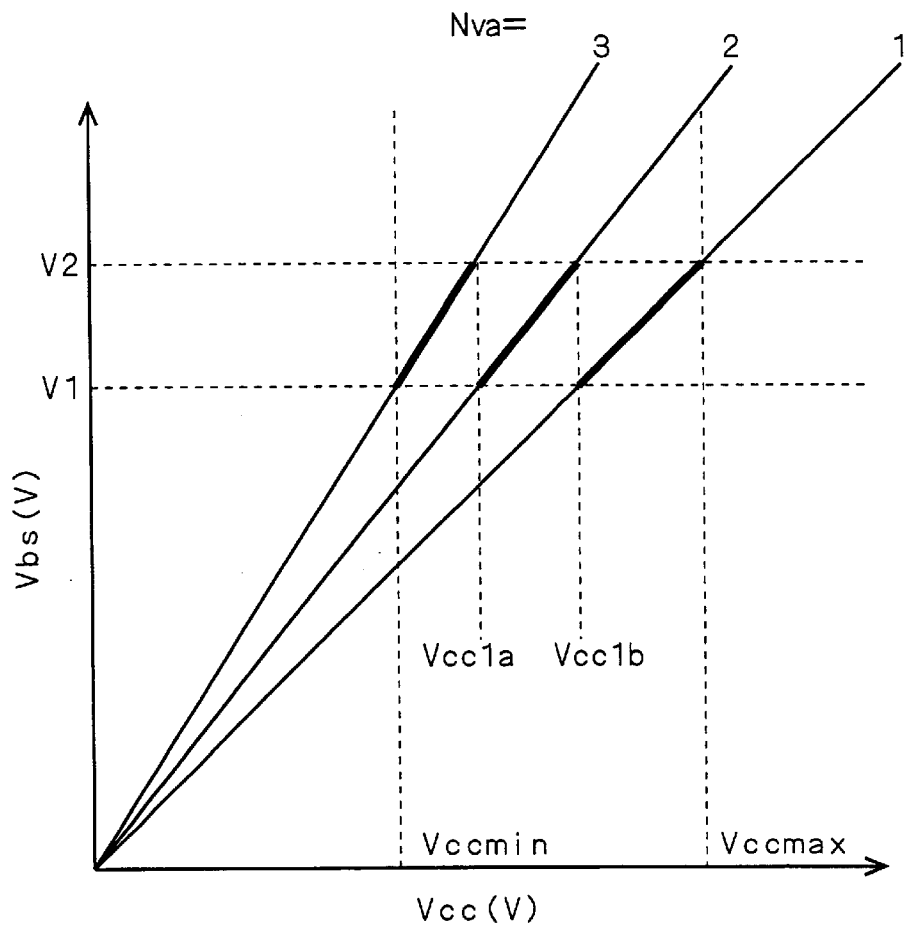
F I G. 1 4
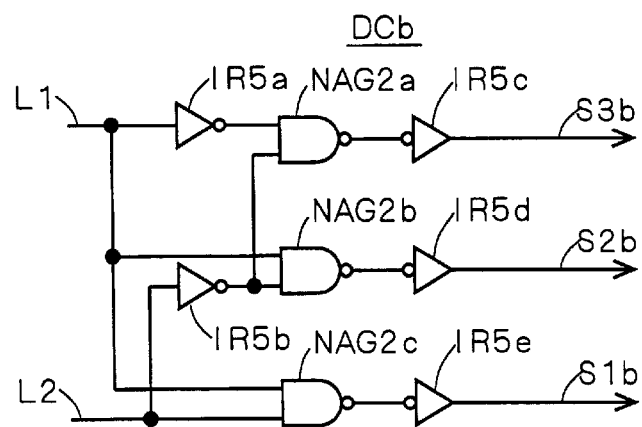

F I G. 27
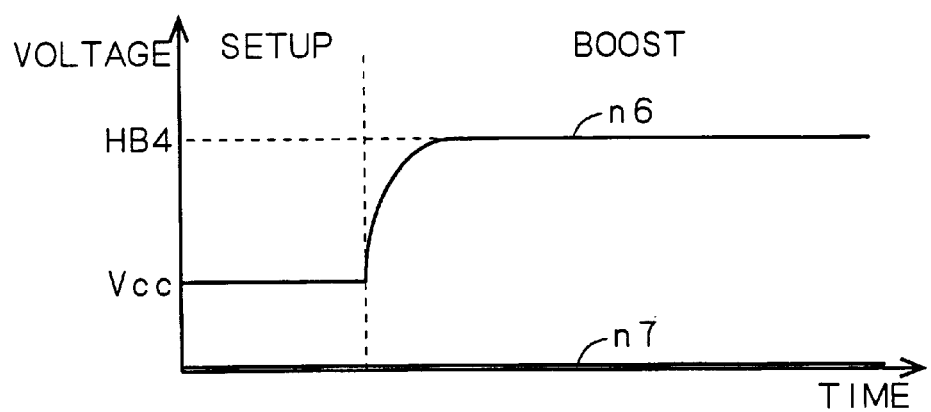
F I G. 28
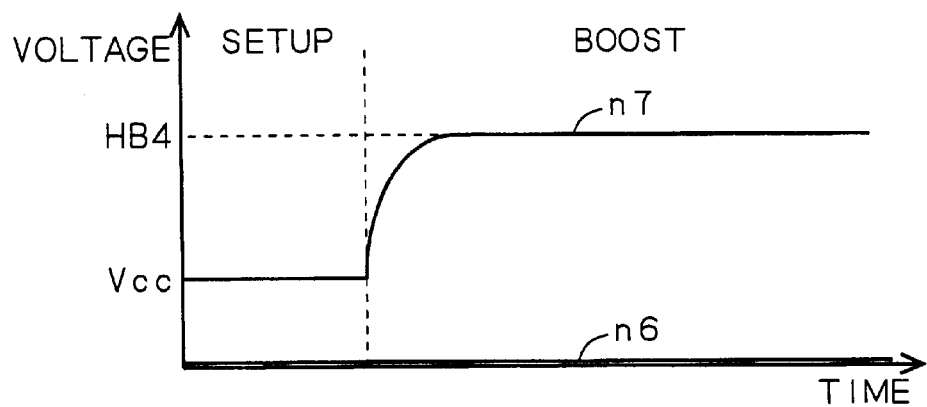

US 6,414,862 B1

BOOSTING CIRCUIT HAVING A DETECTING PORTION FOR DETECTING THE VALUE OF A POWER SUPPLY VOLTAGE

BACKGROUND OF THE INVENTION

1. Field of the Invention

The present invention relates to boosting circuits for boosting the power-supply voltage, and particularly to a word line boosting circuit for generating a voltage in reading operation in a semiconductor storage device having semiconductor non-volatile memory elements.

2. Description of the Background Art

In these years, there is a growing trend toward use of lower power-supply voltages in semiconductor devices in order to reduce the dissipation of power or for another purpose. Also, some semiconductor devices may be required to allow for a wide range between the upper and lower limits of the power-supply voltage. Moreover, in applications of semiconductor devices to various products, the specifications of the required permissible range of the power-supply voltage may differ depending on the product type.

The use of lower, and an increasing variety of, power-supply voltage values are demanded also for semiconductor storage devices having semiconductor non-volatile memory elements such as flash memory elements. In the semiconductor non-volatile memory elements, however, simply lowering the power-supply voltage will increase the read time and thus hinder high-speed operation.

Accordingly such semiconductor storage devices require word line boosting circuits for boosting the word line voltage from the power-supply voltage in reading operation. The word line boosting circuits are required to operate only when needed, e.g. during reading operation, and to be inactive in other states, e.g. during standby state, so as not to waste power.

Now, FIG. 29 shows an example of the configuration of a semiconductor storage device having semiconductor non-volatile memory elements. In FIG. 29, the semiconductor storage device has a memory cell array AR, a data input/output buffer DB for buffering data signals D0 to Dk inputted/outputted to and from the memory cell array AR, and an address buffer AB for buffering address signals A0 to Aj for addressing locations in the memory cell array AR. The memory cell array AR includes a plurality of cells regularly arranged therein, each memory cell including a selecting transistor ST and a pair of semiconductor non-volatile memory elements ME1 and ME2.

In each cell, the semiconductor non-volatile memory elements ME1 and ME2 have their respective drains connected to the source of the selecting transistor ST through an interconnection DL. A gate select line GL is connected to the gate of the selecting transistor ST and a bit line BL0 is connected to its drain. Word lines WLa and WLb are connected to the control gates of the semiconductor non-volatile memory elements ME1 and ME2, and a source line SL is connected to the sources of the two elements. A body line BD is connected to the bodies of the semiconductor non-volatile memory elements ME1 and ME2. A plurality of such cells are arranged in the row direction to form the blocks B0 to Bn and the blocks B0 to Bn are arranged in the column direction to form the memory cell array AR.

A row decoder XD and a column decoder YD are connected to the address buffer AB. Further, a control block CB including a column selecting circuit, a sense amplifier and a page buffer is connected to the column decoder YD. The control block CB is connected also to the data input/output buffer DB. The gate select line GL, word lines WLa and WLb, source line SL and body line BD connected to the cells in the blocks B0 to Bn in the memory cell array AR extend from the row decoder XD. Bit lines BL0 to BLm connected to a plurality of cells in the memory cell array AR across the blocks B0 to Bn extend from the control block CB.

The semiconductor storage device further comprises a microprocessor MP for controlling write and erase of information into and from the semiconductor non-volatile memory elements ME1 and ME2, a positive charge pump circuit CPp for generating a positive high voltage and a negative charge pump circuit CPn for generating a negative high voltage, which are controlled by the microprocessor MP. It further comprises a word line boosting circuit BC for generating a high voltage on the word lines in operation of reading the stored contents. These high-voltage generating circuits operate only when needed, and become inactive in other operations such as standby operation so as not to consume wasteful power.

The outputs of the positive charge pump circuit CPp, negative charge pump circuit CPn and the word line boosting circuit BC are all inputted to a voltage select circuit VS. The voltage select circuit VS gives a positive high voltage for writing to the circuits in the control block CB through a voltage signal line VL1 and also gives a positive or negative high voltage for writing, erasing and reading to the row decoder XD through voltage signal lines VL2.

In this semiconductor storage device, the present invention focuses on the word line boosting circuit BC. In the semiconductor storage device having semiconductor non-volatile memory elements, what is required for the word line boosting circuit BC is not simple generation of a high voltage. This is described referring to FIG. 30.

FIG. 30 is a diagram showing threshold voltages required for channel formation in mass-produced semiconductor non-volatile memory elements and a distribution thereof. In FIG. 30, the horizontal axis shows the threshold voltage VTH and the vertical axis shows the distribution D ($V_{TH}$).

In the case of an N-channel semiconductor non-volatile memory element, for example, its threshold voltage rises when electrons are injected to a floating electrode. In this example, a state in which electrons are injected to the floating electrode is regarded as "1" and a state in which electrons are not is regarded as "0." The threshold voltage corresponding to "1" and the threshold voltage corresponding to "0" differ in different semiconductor non-volatile memory elements, which form a distribution as shown in FIG. 30. The threshold voltage corresponding to "0" of the semiconductor non-volatile memory elements is set in the viewpoint of high-speed access and the threshold voltage corresponding to "1" is set in the viewpoint of securing read margin and reliability.

The values "0" and "1" of the semiconductor non-volatile memory elements are distinguished according to whether the threshold voltage is higher or lower than a reference voltage Vbs. Hence, if the value of the reference voltage Vbs is lower than the upper limit value V1 of the distribution of the threshold voltages corresponding to "0," then "0" may be erroneously determined to be "1." Similarly, if the value of the reference voltage Vbs is higher than the lower limit value V2 of the distribution of the threshold voltages corresponding to "1," then "1" may be erroneously determined to be "0." Therefore the reference voltage Vbs for determining the threshold voltage level must fall between the upper limit value V1 and the lower limit value V2. That is to say, although the word line boosting circuit BC boosts the power-supply voltage, it should not boost it too high.

FIG. 31 is a diagram showing a conventional word line boosting circuit BCe. The word line boosting circuit BCe operates with a boost enable signal BE to generate the boosted voltage Vbs; it gives voltages boosted in the two boosting circuits HCe and VCe to the N-channel MOS transistor TR1. The word line boosting circuit BCe further comprises delay circuits D1 and D2, a NOR gate NOG1, a NAND gate NAG1, and inverters Ih1, Ih2, Iv1 and Iv2.

The boost enable signal BE is inputted to the delay circuits D1 and D2 and also to input ends of the NOR gate NOG1 and NAND gate NAG1. The output DL1 of the delay circuit D1 is inputted to the other input end of the NOR gate NOG1 and the output DL2 of the delay circuit D2 is inputted to the other input end of the NAND gate NAG1.

The output of the NOR gate NOG1 passes through the inverter Ih1 to become a gate boost enable signal HBE and the gate boost enable signal HBE further passes through the inverter Ih2 to become an inverse gate boost enable signal BHBE. The inverse gate boost enable signal BHBE is inputted to the gate boosting circuit HCe.

The output of the NAND gate NAG1 passes through the inverter Iv1 to become a drain boost enable signal VBE and the drain boost enable signal VBE further passes through the inverter Iv2 to become an inverse drain boost enable signal BVBE. The inverse drain boost enable signal BVBE is inputted to the drain boosting circuit VCe.

The output HB of the gate boosting circuit HCe is given to the gate of the transistor TR1 and the output VB of the drain boosting circuit VCe is given to the drain of the transistor TR1. The transistor TR1 turns on when the output HB is applied to its gate and the voltage of the output VB at the drain is applied to a load connected to the source of the transistor TR1.

In this structure, the gate boosting circuit HCe and the drain boosting circuit VCe have structures as shown in FIG. 32. That is to say, the gate boosting circuit HCe has a plurality of boosting stages SGh1e to SGh4e connected in series, where the first boosting stage SGh1e receives the inverse gate boost enable signal BHBE from the inverter Ih2 and the final boosting stage SGh4e generates the output HB. Although this example shows four boosting stages, it may include a larger or a smaller number of stages.

The drain boosting circuit VCe has a plurality of boosting stages SGv1e to SGv3e connected in series, where the first boosting stage SGv1e receives the inverse drain boost enable signal BVBE from the inverter Iv2 and the final boosting stage SGv3e generates the output VB. Although this example shows three boosting stages, it may include a larger or a smaller number of stages.

However, note that it is preferred that the gate boosting circuit HCe should have a slightly larger number of boosting stages than the drain boosting circuit VCe. That is, when the voltage value of the output HB of the gate boosting circuit HCe is sufficiently high and a sufficiently high voltage is applied to the gate of the transistor TR1, then the voltage value of the output VB of the drain boosting circuit VCe can be outputted as the boosted voltage Vbs. If the voltage value of the output HB of the gate boosting circuit HCe is low, the voltage value obtained as the boosted voltage Vbs stays around the output HB minus the threshold voltage of the transistor TR1.

In the gate boosting circuit HCe, while the first boosting stage SGh1e receives only the inverse gate boost enable signal BHBE, the next and following boosting stages SGh2e to SGh4e receive the inverse gate boost enable signal BHBE and also an output from the preceding stage and they each boost the output from the preceding stage using the inverse gate boost enable signal BHBE. Similarly, in the drain boosting circuit VCe, the first boosting stage SGv1e receives only the inverse drain boost enable signal BVBE, but the next and following boosting stages SGv2e and SGv3e receive the inverse drain boost enable signal BVBE and also an output from the preceding stage and they each boost the output from the preceding stage using the inverse drain boost enable signal BVBE.

Now the configuration of the boosting stages is described. The boosting stages in the gate boosting circuit HCe and the drain boosting circuit VCe adopt the unit boosting stages shown below.

FIG. 33 is a diagram showing a specific configuration of a unit boosting stage SGa adopted as the first boosting stages SGh1e and SGv1e. The unit boosting stage SGa has a CMOS connection of a P-channel MOS transistor P11 and an N-channel MOS transistor N11, a CMOS connection of a P-channel MOS transistor P12 and an N-channel MOS transistor N12, a capacitor C1 and a P-channel MOS transistor P13.

That is to say, in the unit boosting stage SGa, the gates of the transistors P11 and N11 are connected to each other and the inverse gate boost enable signal BHBE or inverse drain boost enable signal BVBE is applied there. A power-supply voltage Vcc is applied to the source of the transistor P11 and a ground voltage GND is applied to the source of the transistor N11. The drains of the transistors P11 and N11 are connected to each other and one end (a first end) of the capacitor C1 is connected there.

The transistors P12 and N12 have their respective gates connected to each other, and the inverse gate boost enable signal BHBE or inverse drain boost enable signal BVBE is applied there. The other end (a second end) of the capacitor C1 is connected to the source of the transistor P12 and the ground voltage GND is given to the source of the transistor N12. The transistors P12 and N12 have their respective drains connected to the each other and the gate of the transistor P13 is connected there.

The second end of the capacitor C1 is connected also to the drain of the transistor P13, and the voltage in this portion becomes the output Vouta of the unit boosting stage SGa. The power-supply voltage Vcc is given to the source of the transistor P13. The bodies of the transistors P11 to P13 are connected to their respective sources.

FIG. 34 is a diagram showing a specific configuration of a unit boosting stage SGb adopted in the second and following boosting stages SGh2e to SGh4e and SGv2e and SGv3e. The unit boosting stage SGb has a CMOS connection of a P-channel MOS transistor P21 and an N-channel MOS transistor N21, a CMOS connection of a P-channel MOS transistor P22 and an N-channel MOS transistor N22, a capacitor C2 and a P-channel MOS transistor P23.

That is to say, in the unit boosting stage SGb, the gates of the transistors P21 and N21 are connected to each other and the inverse gate boost enable signal BHBE or inverse drain boost enable signal BVBE is applied there. An input Vina corresponding to an output from the preceding stage is given to the source of the transistor P21 and the ground voltage GND is given to the source of the transistor N21. The drains of the transistors P21 and N21 are connected to each other, to which one end (a first end) of the capacitor C2 is connected.

The transistors P22 and N22 have their respective gates connected to each other, and the inverse gate boost enable signal BHBE or inverse drain boost enable signal BVBE is given there. The other end (a second end) of the capacitor C2 is connected to the source of the transistor P22 and the ground voltage GND is given to the source of the transistor N22. The transistors P22 and N22 have their respective drains connected to each other and the gate of the transistor P23 is connected thereto.

The second end of the capacitor C2 is connected also to the drain of the transistor P23, and the voltage in this portion becomes the output Voutb of the unit boosting stage SGb. The power-supply voltage Vcc is given to the source of the transistor P23. The bodies of the transistors P21 to P23 are connected to their respective sources.

Operation of this word line boosting circuit BCe is now described. FIG. 35 is a timing chart of signal outputs from the individual parts. In this timing chart, the operation of the word line boosting circuit BCe is divided into a setup period for charging the capacitors C1 and C2 and a boost period for giving the boosted voltage to a load connected to the source of the transistor TR1.

First, in response to an ATD (Address Transition Detection) signal generated by a change of the address signal ADD in reading of the stored contents, the boost enable signal BE (e.g. high-active) becomes inactive. The inactive period PD1 of the boost enable signal BE is about 20 ns, for example. The inactivated change of the boost enable signal BE corresponds to the beginning of the setup period.

The change to inactive of the boost enable signal BE is sequentially transferred through the NOR gate NOG1 and the inverter Ih1 while being delayed in the delay circuit D1, and it changes the gate boost enable signal HBE, reflecting the amount of delay in the delay circuit D1. In FIG. 35, the total amount of delays in the delay circuit D1, NOR gate NOG1 and inverter Ih1 is shown as delay 3.

The change to inactive of the boost enable signal BE is sequentially transferred through the NAND gate NAG1 and the inverter Iv1 while being delayed in the delay circuit D2. However, in the NAND gate NAG1, the inactivated change of the boost enable signal BE immediately appears as a change in the output, so that it changes the drain boost enable signal VBE without reflecting the amount of delay in the delay circuit D2. However, the delay circuit D2, NAND gate NAG1 and inverter Iv1 each cause a slight gate delay; FIG. 35 shows the total amount of delays in the delay circuit D2, NAND gate NAG1 and inverter Iv1 as delay 0.

The change of the gate boost enable signal HBE passes through the inverter Ih2 to change the inverse gate boost enable signal BHBE, which change is transferred to the boosting stages in the gate boosting circuit HCe. First, in the first stage SGh1e, the transistor N11 becomes conductive and gives the ground voltage GND to the first end of the capacitor C1. Further, the transistor N12 becomes conductive and gives the ground voltage GND to the gate of the transistor P13. When the transistor P13 becomes conductive, the power-supply voltage Vcc is given to the second end of the capacitor C1. The capacitor C1 is thus charged.

When the transistor P13 becomes conductive, the power-supply voltage Vcc is given also as the output Vouta of the first stage SGh1e. Then the input Vina to the next stage SGh2e becomes equal to the power-supply voltage Vcc. Like the capacitor C1, the capacitor C2, too, is supplied with the ground voltage GND at its one end (a first end) and the power-supply voltage Vcc at the other end (a second end). The capacitor C2 is thus charged.

The same takes place also in the following boosting stages SGh3e and SGh4e and the capacitors in these stages are thus charged. Therefore the power-supply voltage Vcc appears at the output HB of the gate boosting circuit HCe at this time.

This applies also to the boosting stages in the drain boosting circuit VCe; FIG. 35 shows the condition in which the output HB of the gate boosting circuit HCe and the output VB of the drain boosting circuit VCe are both brought back to the power-supply voltage Vcc in the setup period.

When the boost enable signal BE goes active, the change is sequentially transferred through the NOR gate NOG1 and the inverter Ih1 while being delayed in the delay circuit D1. However, in the NOR gate NOG1, the activated change of the boost enable signal BE immediately appears as a change in the output, so that it changes the gate boost enable signal HBE without reflecting the amount of delay in the delay circuit D1. However, the delay circuit D1, NOR gate NOG1 and inverter Ih1 each cause a slight gate delay; FIG. 35 shows the total amount of delays in the delay circuit D1, NOR gate NOG1 and inverter Ih1 as delay 1.

The activated change of the boost enable signal BE is sequentially transferred through the NAND gate NAG1 and the inverter Iv1 while being delayed in the delay circuit D2, and it changes the gate boost enable signal HBE, reflecting the amount of delay in the delay circuit D2. In FIG. 35, the total amount of delays in the delay circuit D2, NAND gate NAG1 and inverter Iv1 is shown as delay 2.

The change of the gate boost enable signal HBE passes through the inverter Ih2 and changes the inverse gate boost enable signal BHBE, which change is transferred to the boosting stages in the gate boosting circuit HCe. First, in the first stage SGh1e, the transistor P12 becomes conductive and the transistor P13 turns off, and the potential at the second end of the capacitor C1 goes in a floating state. Since the capacitor C1 was being charged till a moment before, the voltage Vcc is occurring between both ends thereof.

The transistor P11 becomes conductive and the power-supply voltage Vcc is given to the first end of the capacitor C1. Then the voltage at the second end of the capacitor C1 in the floating state becomes 2Vcc. Therefore the output Vouta of the first stage SGh1e becomes 2Vcc.

The input Vina to the second stage SGh2e becomes 2Vcc, and the voltage Vcc is occurring between both ends of the capacitor C2 as in the capacitor C1, so the output Voutb of the second stage SGh2e becomes 3Vcc.

The same occurs in the following boosting stages SGh3e and SGh4e and the voltage has been thus boosted in each stage. Therefore a voltage at 5Vcc, which has been boosted five times the power-supply voltage Vcc, appears as the output HB of the gate boosting circuit HCe. The actual voltage value appearing as the output HB is smaller than 5Vcc because of the parasitic capacitance between the source and drain of the transistors in each boosting stage, the interconnection capacitance at the output HB, the gate capacitance of the transistor TR1, etc.

This occurs also in the boosting stages in the drain boosting circuit VCe, where a voltage of 4Vcc, which has been boosted four times the power-supply voltage Vcc, appears as the output VB of the drain boosting circuit VCe. As stated before, it is desired that the value of the output HB be boosted larger with a sufficient margin MG than the value of the output VB. The value of the margin MG may be 1.5 V or more, for example. The beginning of the boost of the output VB of the drain boosting circuit VCe is the end of the setup period and the start of the boost period.

The timing of the signal transitions is shifted between the gate boost enable signal HBE and the drain boost enable signal VBE using the delay circuits D1 and D2, NOR gate NOG1 and NAND gate NAG1 for the following reason.

The boost in the drain boosting circuit VCe is delayed behind the boost in the gate boosting circuit HCe through the presence of the period "delay 2" for the reason below. That is to say, the drain and source of the transistor TR1 are made to conduct while the output VB is at the power-supply voltage Vcc so as to start the boost after once setting the voltage of the load connected to the source of the transistor TR1 at the power-supply voltage Vcc.

The setup in the gate boosting circuit HCe is delayed behind the setup in the drain boosting circuit VCe through the presence of the period "delay 3" for the reason below. That is to say, the setup of the drain boosting circuit VCe is started while the output HB is being boosted and the drain and source of the transistor TR1 are conducting, so as to electrically disconnect the transistor TR1 and the load connected to the source of the transistor TR1 after drawing off the charge of the load to a certain extent with the transistor N22. FIG. 36 shows an equivalent circuit of the word line boosting circuit BCe during boosting. FIG. 36 shows the number of unit boosting stages in the drain boosting circuit VCe as Nv and the capacitors in the unit boosting stages as Cv1 to CvNv. The load connected to the source of the transistor TR1 is shown as capacitance CvLD.

The relation between the boosted voltage Vbs and the power-supply voltage Vcc is now expressed in equations by using this equivalent circuit. First, assuming that the transistor TR1 is off, the voltages in the individual parts during boosting are given as:

$$VB = (Nv+1) \times Vcc \quad\quad 1$$

$$Vbs = Vcc \quad\quad 2$$

Since the transistor TR1 turns on in real boosting, redistribution of charge occurs between the capacitors Cv1 to CvNv and the load capacitance CvLD. Now, considering the conservation of charge, the equation below holds:

$$\frac{Cvboost}{Nv}\{(Nv+1) \times Vcc - Vcc\} + Cvload \times Vcc = \frac{Cvboost}{Nv}(Vbs - Vcc) + Cvload \times Vbs \quad\quad 3$$

The left side expresses the amount of charge on the "off" assumption and the right side expresses the amount of charge on the "on" assumption. Cvboost indicates the capacitance value of each of the capacitors Cv1 to CvNv and Cvload indicates the capacitance value of the load capacitance CvLD.

Equation 3 can be rearranged as:

$$(Nv \times Cvload + Cvboost) \times Vbs = \{Nv \times Cvload + (Nv+1) \times Cvboost\} \times Vcc \quad\quad 4$$

Equation 4 can be rearranged as:

$$Vbs = \frac{Nv \times Cvload + (Nv+1) \times Cvboost}{Nv \times Cvload + Cvboost} \times Vcc \quad\quad 5$$

As can be seen from Equation 5, the boosted voltage Vbs is proportional to the power-supply voltage Vcc. Equation 5 can be represented in the graph of FIG. 37.

In FIG. 37, the range of the power-supply voltage Vcc used in the semiconductor device is expressed as the range from the lower limit Vccmin to the upper limit Vccmax. The graph also shows, on the axis of the boosted voltage Vbs, the upper limit value V1 of the above-described threshold voltage distribution corresponding to "0" of the semiconductor non-volatile memory elements and the lower limit value V2 of the threshold voltage distribution corresponding to "1."

As stated before, the boosted voltage Vbs must be larger than the upper limit value V1 and smaller than the lower limit value V2. The value of the power-supply voltage Vcc which satisfies this condition is limited within the range "OK" shown in FIG. 37. That is to say, in the range between the lower limit Vccmin and the upper limit Vccmax, boosted voltages in the range "NG1" below the range "OK" cause failure to comply with the specifications by the shortage of voltage AM1 and boosted voltages in the range "NG2" over the range "OK" cause failure to comply with the specifications by the excess of voltage AM2.

This cannot be solved just by changing the gradient of the graph of FIG. 37 by adjusting various parameters in Equation 5. For example, the range "NG1" under the upper limit value V1 can be made smaller by making the graph steeper. However, this enlarges the range "NG2" over the lower limit value V2. On the other hand, making the gradient of the graph gentler to make the range "NG2" smaller enlarges the range "NG1."

In this way, the conventional word line boosting circuit has been restricted in that the value of the power-supply voltage Vcc must be such that the boosted voltage Vbs falls within the range between the upper limit value V1 and the lower limit value V2 of the threshold voltage distribution of the semiconductor non-volatile memory elements. Accordingly they have been subjected to restriction when the range between the upper and lower limits of the permissible power-supply voltage range required for the semiconductor device is large and when the specifications of the required permissible power-supply voltage range differ product by product.

For example, when one type of product requires 1.65 to 2.2 V as the characteristic of the power-supply voltage, another type of product may require 2.2 to 2.7 V as the power-supply voltage characteristic, and still another type of product may require 2.7 to 3.6 V as the power-supply voltage characteristic. In such a case, semiconductor storage devices adopting the conventional word line boosting circuit had to be adjusted by varying the number of boosting stages and the capacitance value of the capacitors in the boosting stages, depending on the product type. More specifically, it has been necessary to prepare photomasks for photolithography for each product type and to pattern the photomasks in accordance with the product type.

However, preparing photomasks for each product type unavoidably leads to an increase in cost.

SUMMARY OF THE INVENTION

According to a first aspect of the present invention, a boosting circuit comprises: a detecting portion for detecting the value of a power-supply voltage; and a first boosting stage comprising a plurality of capacitors, for boosting the power-supply voltage using at least one of the plurality of capacitors, wherein the detecting portion determines, in accordance with the detected value of the power-supply voltage, whether to use one of the plurality of capacitors alone in the first boosting stage or to use a parallel connection of some or all of the plurality of capacitors.

Preferably, according to a second aspect, the boosting circuit further comprises a transistor having first and second current electrodes and a control electrode, and a second boosting stage comprising a capacitor, for boosting the power-supply voltage by using the capacitor, wherein the first boosting stage applies the power-supply voltage as boosted to the first current electrode of the transistor, and the second boosting stage applies the power-supply voltage as boosted to the control electrode of the transistor.

Preferably, according to a third aspect, the boosting circuit further comprises a transistor having first and second current electrodes and a control electrode, and a second boosting stage comprising a capacitor, for boosting the power-supply voltage by using the capacitor, wherein the first boosting stage applies the power-supply voltage as boosted to the control electrode of the transistor, and the second boosting stage applies the power-supply voltage as boosted to the first current electrode of the transistor.

According to a fourth aspect of the present invention, a boosting circuit comprises: a detecting portion for detecting the value of a power-supply voltage; and a plurality of boosting stages each comprising a capacitor, for boosting the power-supply voltage by using the capacitor, wherein the plurality of boosting stages are connected in series, and the detecting portion determines which output of the plurality of boosting stages should be used in accordance with the detected value of the power-supply voltage.

Preferably, according to a fifth aspect, the boosting circuit further comprises a transistor having first and second current electrodes and a control electrode, and the boosting stages apply the power-supply voltage as boosted to the first current electrode of the transistor.

Preferably, according to a sixth aspect, the boosting circuit further comprises a transistor having first and second current electrodes and a control electrode, and the boosting stages apply the power-supply voltage as boosted to the control electrode of the transistor.

According to a seventh aspect of the present invention, a boosting circuit comprises: a detecting portion for detecting the value of a power-supply voltage; a transistor having first and second current electrodes and a control electrode; and first and second boosting stages each comprising a capacitor, for boosting the power-supply voltage by using the capacitor, wherein the first boosting stage applies the power-supply voltage as boosted to the first current electrode of the transistor, the second boosting stage applies the power-supply voltage as boosted to the control electrode of the transistor, and the detecting portion varies the amount of boost in the first or second boosting stage in accordance with the detected value of the power-supply voltage.

Preferably, according to an eighth aspect, the boosting circuit is used as a word line boosting circuit in a semiconductor storage device comprising a semiconductor non-volatile memory element, a word line connected to the semiconductor non-volatile memory element, and the word line boosting circuit for reading the contents stored in the semiconductor non-volatile memory element through the word line.

According to a ninth aspect of the present invention, a semiconductor storage device comprises: a semiconductor non-volatile memory element, a word line connected to the semiconductor non-volatile memory element, and a word line boosting circuit for reading the contents stored in the semiconductor non-volatile memory element through the word line, wherein the word line boosting circuit is constructed from one of the boosting circuits of the first aspect to the seventh aspect.

According to the first aspect of the invention, the detecting portion determines whether to use only one of the plurality of capacitors in the first boosting stage or to use a parallel connection of some or all of the plurality of capacitors, in accordance with the detected value of the power-supply voltage. Accordingly power-supply voltages over a wide magnitude range can be used while generating the boosted voltage within the range between the upper and lower limit values of the threshold voltage distribution of semiconductor non-volatile memory elements.

According to the second aspect of the invention, the first boosting stage applies the boosted power-supply voltage to the first current electrode of the transistor. Accordingly, when a load is connected to the second current electrode of the transistor, a large voltage can be generated between both ends of the load.

According to the third aspect of the invention, the first boosting stage applies the boosted power-supply voltage to the control electrode of the transistor. Accordingly, when a load is connected to the second current electrode of the transistor, a large voltage can be generated between both ends of the load.

According to the fourth aspect of the invention, the detecting portion determines, in accordance with the detected value of the power-supply voltage, which output to use among the outputs from the plurality of boosting stages. Accordingly power-supply voltages of various magnitudes can be used while generating the boosted voltage within the range between the upper and lower limit values of the threshold voltage distribution of semiconductor non-volatile memory elements.

According to the fifth aspect of the invention, the boosting stages apply the boosted power-supply voltage to the first current electrode of the transistor. Accordingly, when a load is connected to the second current electrode of the transistor, a large voltage can be generated between both ends of the load.

According to the sixth aspect of the invention, the boosting stages apply the boosted power-supply voltage to the control electrode of the transistor. Accordingly, when a load is connected to the second current electrode of the transistor, a large voltage can be generated between both ends of the load.

According to the seventh aspect of the invention, the detecting portion varies the amount of boosting in the first or second boosting stage in accordance with the detected value of the power-supply voltage. Accordingly power-supply voltages over a wide magnitude range can be used while generating the boosted voltage within the range between the upper and lower limit values of the threshold voltage distribution of semiconductor non-volatile memory elements. Further, when a load is connected to the second current electrode of the transistor, a large voltage can be generated between both ends of the load.

According to the eighth aspect of the invention, the word line boosting circuit is composed of any of the boosting circuits of the first to seventh aspects of the invention. Therefore it is possible to obtain a semiconductor storage device which can use power-supply voltages of various magnitudes while generating the boosted voltage within the range between the upper and lower limit values of the threshold voltage distribution of the semiconductor non-volatile memory elements.

An object of the present invention is to provide a word line boosting circuit which, regardless of varying value of the power-supply voltage, can generate a boosted voltage within the range between the upper and lower limit values of the threshold voltage distribution of semiconductor non-volatile memory elements.

BRIEF DESCRIPTION OF THE DRAWINGS

FIGS. 13 is a diagram showing the relation between the boosted voltage and the power-supply voltage in the word line boosting circuit of the second preferred embodiment.

FIGS. 14 and 15 are diagrams showing parts of the word line boosting circuit of the second preferred embodiment.

FIGS. 27 and 28 are timing charts showing operation of the word line boosting circuit of the fourth preferred embodiment.

DESCRIPTION OF THE PREFERRED EMBODIMENTS

First Preferred Embodiment

This preferred embodiment is directed to a word line boosting circuit in which the number of capacitors can be varied during boosting in accordance with the value of the power-supply voltage Vcc so that the boosted voltage falls within the range between the upper and lower limit values of the threshold voltage distribution of semiconductor non-volatile memory elements.

Figure 1:
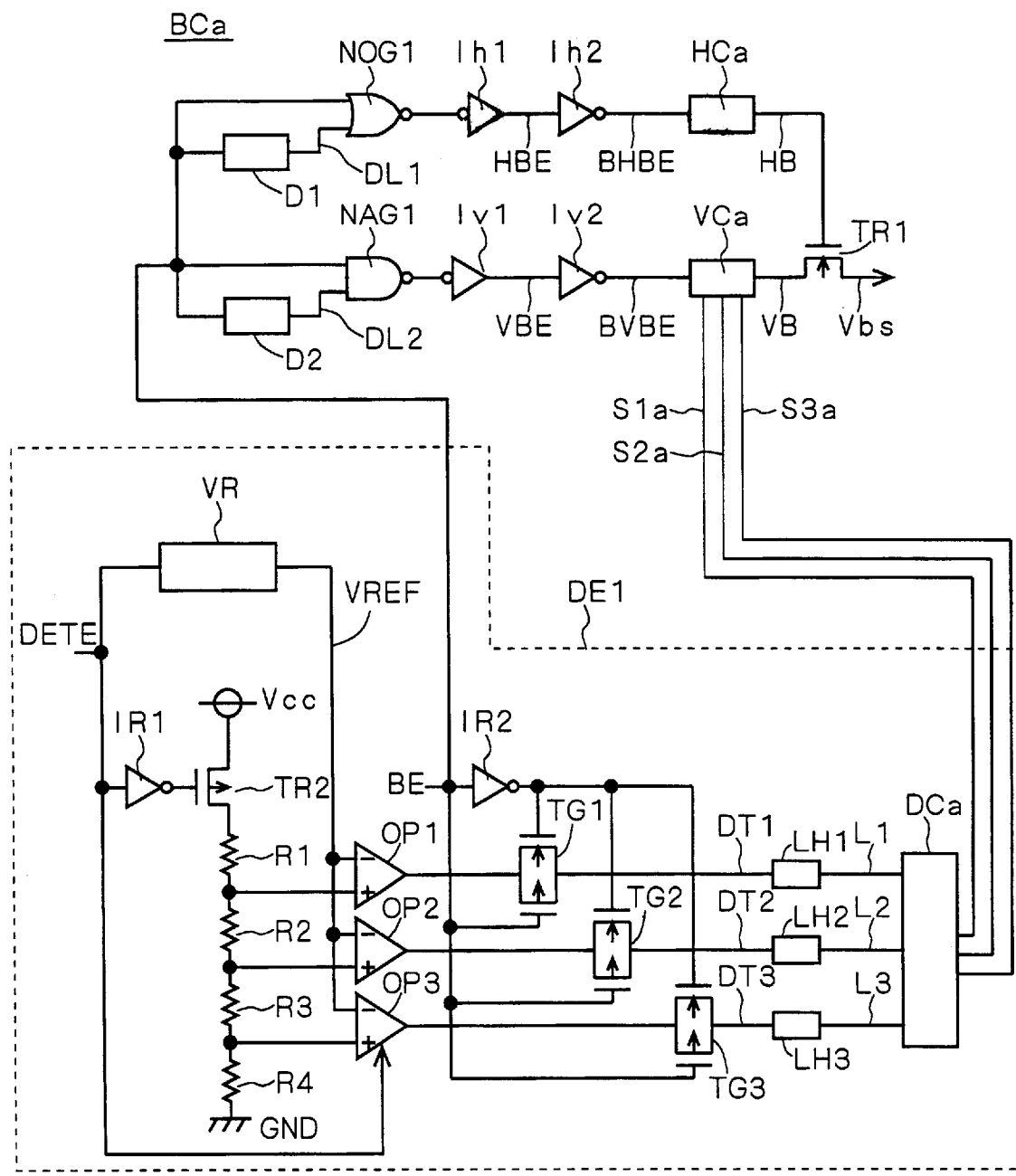
FIG. 1 is a diagram showing a word line boosting circuit according to a first preferred embodiment.

FIG. 1 is a diagram showing a word line boosting circuit BCa of a first preferred embodiment of the invention. In FIG. 1, elements having the same functions as those in the conventional word line boosting circuit BCe are shown at the same reference characters. The word line boosting circuit BCa of this preferred embodiment, too, includes two boosting circuits HCa and VCa and the N-channel MOS transistor TR1. The circuit operates with the boost enable signal BE and generates the boosted voltage Vbs by giving the voltages boosted in the two boosting circuits HCa and VCa to the transistor TR1. Like the conventional word line boosting circuit BCe, the word line boosting circuit BCa too has the delay circuits D1, D2, NOR gate NOG1, NAND gate NAG1, inverters Ih1, Ih2, Iv1 and Iv2.

The boost enable signal BE is inputted to the delay circuits D1 and D2 and also to input ends of the NOR gate NOG1 and NAND gate NAG1. The output DL1 of the delay circuit D1 is inputted to the other input end of the NOR gate NOG1 and the output DL2 of the delay circuit D2 is inputted to the other input end of the NAND gate NAG1.

The output of the NOR gate NOG1 passes through the inverter Ih1 to become the gate boost enable signal HBE and the gate boost enable signal HBE further passes through the inverter Ih2 to become the inverse gate boost enable signal BHBE. The inverse gate boost enable signal BHBE is inputted to the gate boosting circuit HCa.

The output of the NAND gate NAG1 passes through the inverter Iv1 to become the drain boost enable signal VBE and the drain boost enable signal VBE further passes through the inverter Iv2 to become the inverse drain boost enable signal BVBE. The inverse drain boost enable signal BVBE is inputted to the drain boosting circuit VCa.

The output HB of the gate boosting circuit HCa is given to the gate of the transistor TR1 and the output VB of the drain boosting circuit VCa is given to the drain of the transistor TR1. The transistor TR1 turns on when the output HB is applied to its gate and the voltage of the output VB at the drain is applied to a load connected to the source of the transistor TR1.

The word line boosting circuit BCa of this preferred embodiment further comprises, in addition to the components above, a power-supply voltage detecting portion DE1 which operates with a detect enable signal DETE. This power-supply voltage detecting portion DE1 detects the value of the power-supply voltage Vcc and outputs operation signals S1a to S3a for varying the amount of voltage boost in the drain boosting circuit VCa in accordance with the value of the power-supply voltage Vcc.

The power-supply voltage detecting portion DE1 includes a P-channel MOS transistor TR2, an inverter IR1, resistors R1 to R4, and comparators OP1 to OP3 to resistor-divide and detect the value of the power-supply voltage Vcc. Further, the power-supply voltage detecting portion DE1 includes a reference voltage generating circuit VR, and also an inverter IR2, transfer gates TG1 to TG3, and latch circuits LH1 to LH3 for holding the detected results about the power-supply voltage Vcc during the active period of the boost enable signal BE. It further includes a decoder DCa for generating the operation signals S1a to S3a on the basis of the detection of the power-supply voltage Vcc.

That is to say, the detect enable signal DETE is applied to the reference voltage generating circuit VR and, when the detect enable signal DETE is active, the reference voltage generating circuit VR outputs a reference voltage VREF which has a constant value. This reference voltage VREF is inputted to the negative input ends of the comparators OP1 to OP3. The detect enable signal DETE is also applied to the comparators OP1 to OP3, whereby the comparators OP1 to OP3 operate.

The detect enable signal DETE is inputted also to the inverter IR1, where the signal is inverted and provided as its output. The output of the inverter IR1 is inputted to the gate of the transistor TR2. The transistor TR2 is supplied with the power-supply voltage Vcc at its source, and its drain is connected to one end (a first end) of the resistor R1. The other end (a second end) of the resistor R1 is connected to one end (a first end) of the resistor R2. The other end (a second end) of the resistor R2 is connected to one end (a first end) of the resistor R3 and the other end (a second end) of the resistor R3 is connected to one end (a first end) of the resistor R4. The other end (a second end) of the resistor R4 is supplied with the ground voltage GND.

The second end of the resistor R1 is also connected to the positive input end of the comparator OP1. The second end of the resistor R2 is connected to the positive input end of the comparator OP2 and the second end of the resistor R3 is connected to the positive input end of the comparator OP3.

The outputs of the comparators OP1 to OP3 are inputted to the transfer gates TG1 to TG3, respectively. In each of the transfer gates TG1 to TIG3, the gate of a P-channel MOS transistor is supplied with the boost enable signal BE and the gate of an N-channel MOS transistor is supplied with an inverted signal of the boost enable signal BE through the inverter IR2.

The outputs DT1 to DT3 from the transfer gates TG1 to TG3 are inputted to the latch circuits LH1 to LH3, respectively. The outputs L1 to L3 from the latch circuits LH1 to LH3 are inputted to the decoder DCa.

Figure 2:
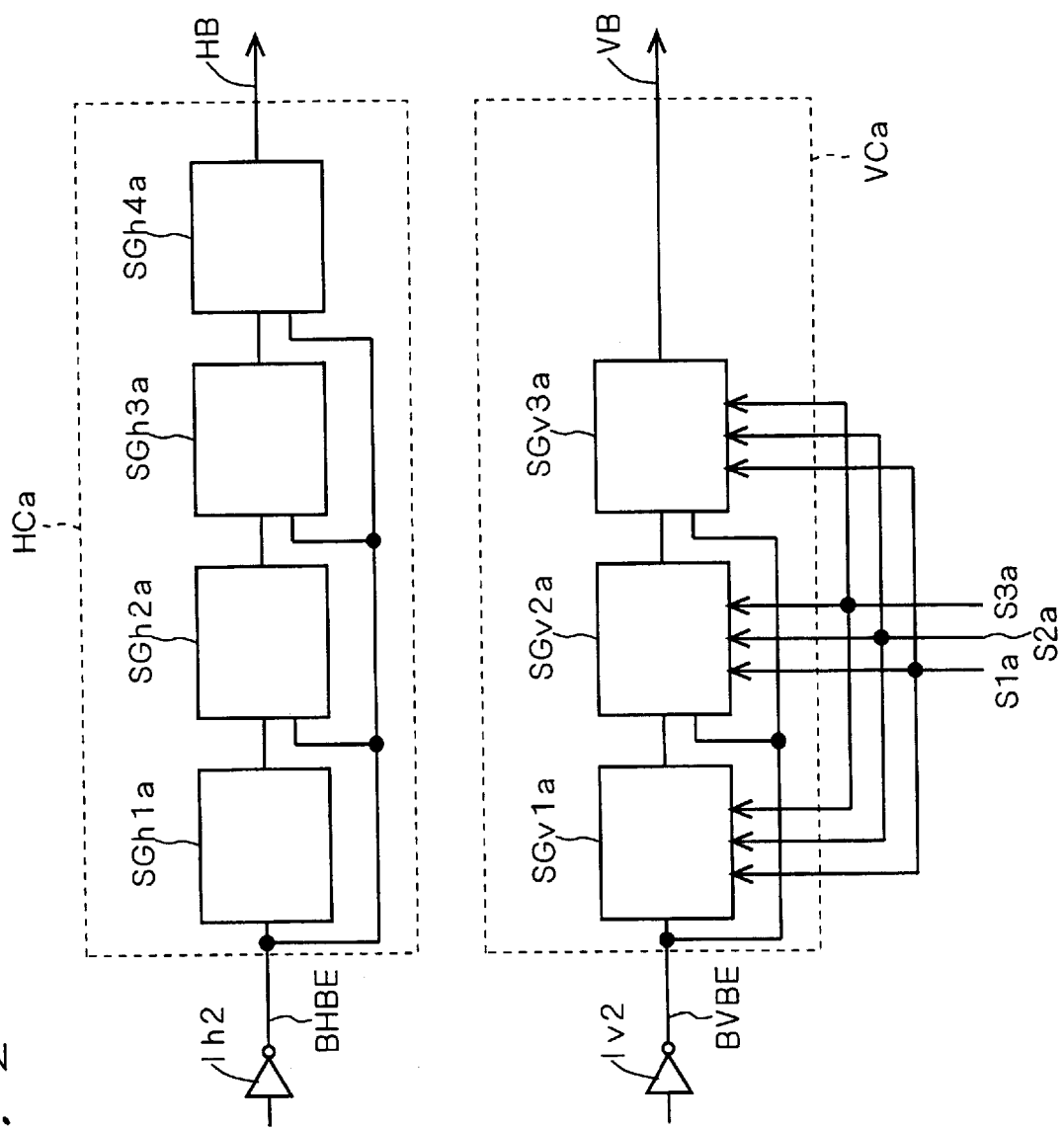
FIGS. 2 to 4 are diagrams showing parts of the word line boosting circuit of the first preferred embodiment.

The gate boosting circuit HCa and the drain boosting circuit VCa have structures as shown in FIG. 2. That is to say, the gate boosting circui HCa has a plurality of boosting stages SGh1a to SGh4a connected in series, where the first boosting stage SGh1a receives the inverse gate boost enable signal BHBE from the inverter Ih2 and the final boosting stage SGh4a generates the output HB. Although this example shows four boosting stages, it may include a larger or a smaller number of stages.

The drain boosting circuit VCa includes a plurality of boosting stages SGv1a to SGv3a connected in series, where the first boosting stage SGv1a receives the inverse drain boost enable signal BVBE from the inverter Iv2 and the final boosting stage SGv3a generates the output VB. The plurality of boosting stages SGv1a to SGv3a receive the operation signals S1a to S3a outputted from the power-supply voltage detecting portion DE1.

Although this example shows three boosting stages, it may include a larger or a smaller number of stages. However, note that it is preferred that the gate boosting circuit HCa have a slightly larger number of boosting stages than the drain boosting circuit VCa, for the same reason described about the conventional drain boosting circuit VCe.

In the gate boosting circuit HCa, while the first boosting stage SGh1a receives only the inverse gate boost enable signal BHBE, the next and following boosting stages SGh2a to SGh4a receive the inverse gate boost enable signal BHBE and also an output from the preceding stage, and they each boost the output from the preceding stage using the inverse gate boost enable signal BHBE. Similarly, in the drain boosting circuit VCa, while the first boosting stage SGv1a receives only the inverse drain boost enable signal BVBE, the next and following boosting stages SGv2a and SGv3a receive the inverse drain boost enable signal BVBE and also an output from the preceding stage, and they each boost the output from the preceding stage using the inverse drain boost enable signal BVBE.

The structures of the boosting stages are now described. The boosting stages in the gate boosting circuit HCa adopt the unit boosting stages SGa and SGb shown in FIGS. 33 and 34. Therefore the gate boosting circuit HCa has the same structure as the conventional gate boosting circuit HCe, which is not described again ere.

The boosting stages in the drain boosting circuit VCa adopt unit boosting stages SGc and SGd constructed as follows.

Figure 3:
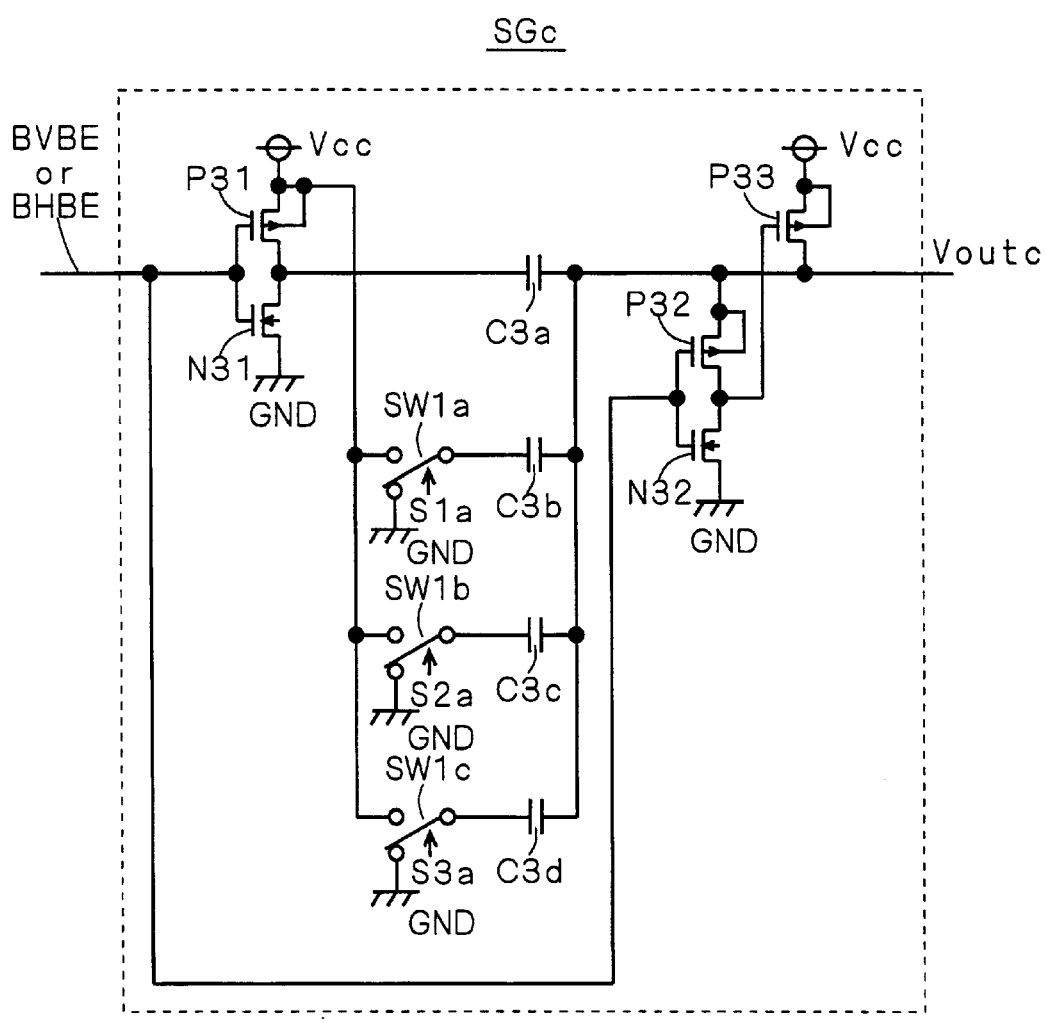

FIG. 3 is a diagram showing a specific configuration of a unit boosting stage SGc adopted in the first boosting stage SGv1a in the drain boosting circuit VCa. The unit boosting stage SGc has a CMOS connection of a P-channel MOS transistor P31 and an N-channel MOS transistor N31, a CMOS connection of a P-channel MOS transistor P32 and an N-channel MOS transistor N32, and a P-channel MOS transistor P33. The unit boosting stage SGc further has capacitors C3a to C3d and switch circuits SW1a to SW1c.

That is to say, in the unit boosting stage SGc, the gates of the transistors P31 and N31 are connected to each other and the inverse drain boost enable signal BVBE is applied thereto. The power-supply voltage Vcc is applied to the source of the transistor P31 and the ground voltage GND is applied to the source of the transistor N31. The drains of the transistors P31 and N31 are connected to each other, to which one end (a first end) of the capacitor C3a is connected.

The transistors P32 and N32 have their respective gates connected to each other, to which the inverse drain boost enable signal BVBE is applied. The other end (a second end) of the capacitor C3a is connected to the source of the transistor P32 and the ground voltage GND is given to the source of the transistor N32. The transistors P32 and N32 have their respective drains connected to the each other and the gate of the transistor P33 is connected thereto.

The second end of the capacitor C3a is connected also to the drain of the transistor P33, and the voltage in this portion becomes the output Voutc of the unit boosting stage SGc. The power-supply voltage Vcc is given to the source of the transistor P33. The bodies of the transistors P31 to P33 are connected to their respective sources.

One end (a first end) of each of the switch circuits SW1a to SW1c is connected to the source of the transistor P31. The other end (a second end) of each of the switch circuits SW1a to SW1c is connected to one end (a first end) of a corresponding one of the capacitors C3b to C3d. The other ends (second ends) of the capacitors C3b to C3d are connected to the second end of the capacitor C3a.

The switch circuits SW1a to SW1c have a function of connecting their first ends to the ground voltage GND or to the source of the transistor P31 in accordance with the operation signals S1a to S3a, respectively.

Figure 4:
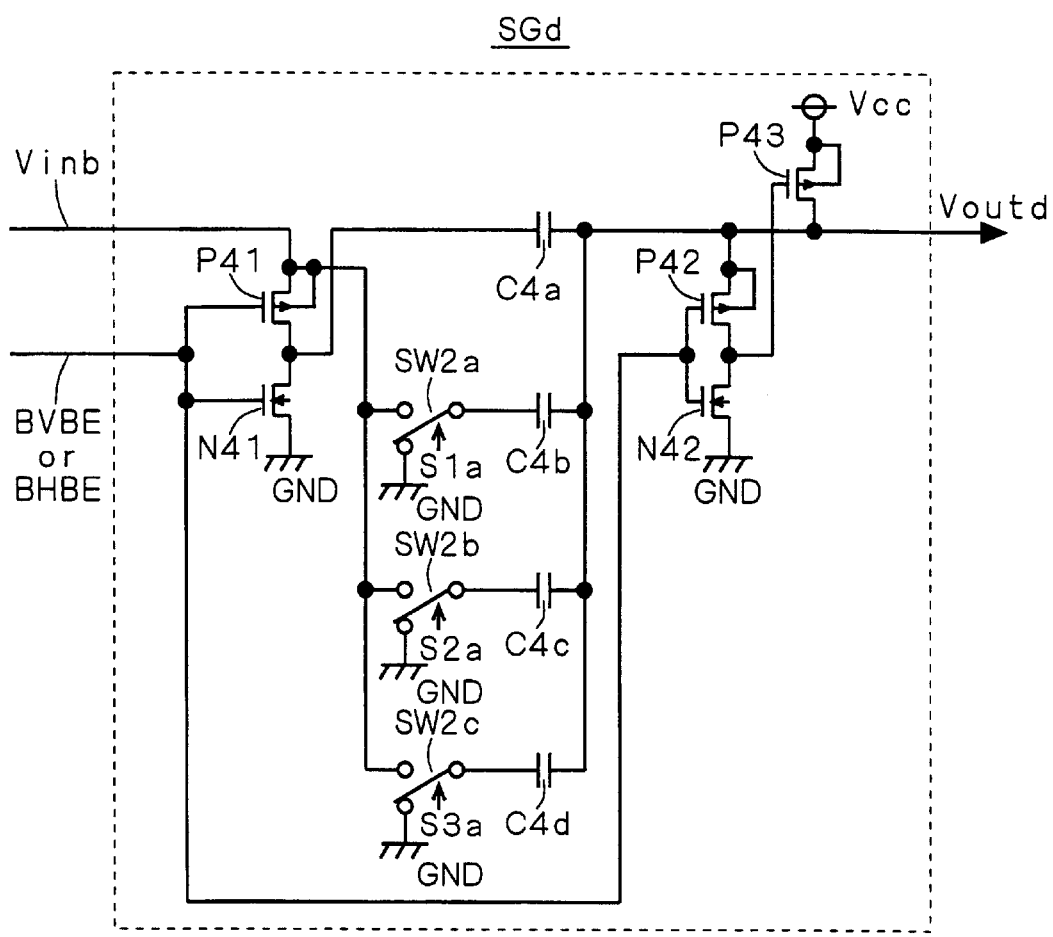

FIG. 4 is a diagram showing a specific configuration of a unit boosting stage SGd adopted in the second and following boosting stages SGv2a and SGv3a in the drain boosting circuit VCa. The unit boosting stage SGd has a CMOS connection of a P-channel MOS transistor P41 and an N-channel MOS transistor N41, a CMOS connection of a P-channel MOS transistor P42 and an N-channel MOS transistor N42, and a P-channel MOS transistor P43. The unit boosting stage SGd further includes capacitors C4a to C4d and switch circuits SW2a to SW2c.

That is to say, in the unit boosting stage SGd, the gates of the transistors P41 and N41 are connected to each other, to which the inverse drain boost enable signal BVBE is applied. The input Vinb, namely the output from the preceding stage is applied to the source of the transistor P41 and the ground voltage GND is applied to the source of the transistor N41. The drains of the transistors P41 and N41 are connected to each other and one end (a first end) of the capacitor C4a is connected thereto.

The transistors P42 and N42 have their respective gates connected to each other, to which the inverse drain boost enable signal BVBE is applied. The other end (a second end) of the capacitor C4a is connected to the source of the transistor P42 and the ground voltage GND is given to the source of the transistor N42. The transistors P42 and N42 have their respective drains connected to each other and the gate of the transistor P43 is connected thereto.

The second end of the capacitor C4a is connected also to the drain of the transistor P43 and the voltage in this portion becomes the output Voutd of the unit boosting stage SGd. The power-supply voltage Vcc is given to the source of the transistor P43. The bodies of the transistors P41 to P43 are connected to their respective sources.

One end (a first end) of each of the switch circuits SW2a to SW2c is connected to the source of the transistor P41. The other end (a second end) of each of the switch circuits SW2a to SW2c is connected to one end (a first end) of a corresponding one of the capacitors C4b to C4d. The other ends (second ends) of the capacitors C4b to C4d are all connected to the second end of the capacitor C4a.

The switch circuits SW2a to SW2c have a function of connecting their first ends to the ground voltage GND or to the source of the transistor P41 in accordance with the operation signals S1a to S3a, respectively.

Figure 5:
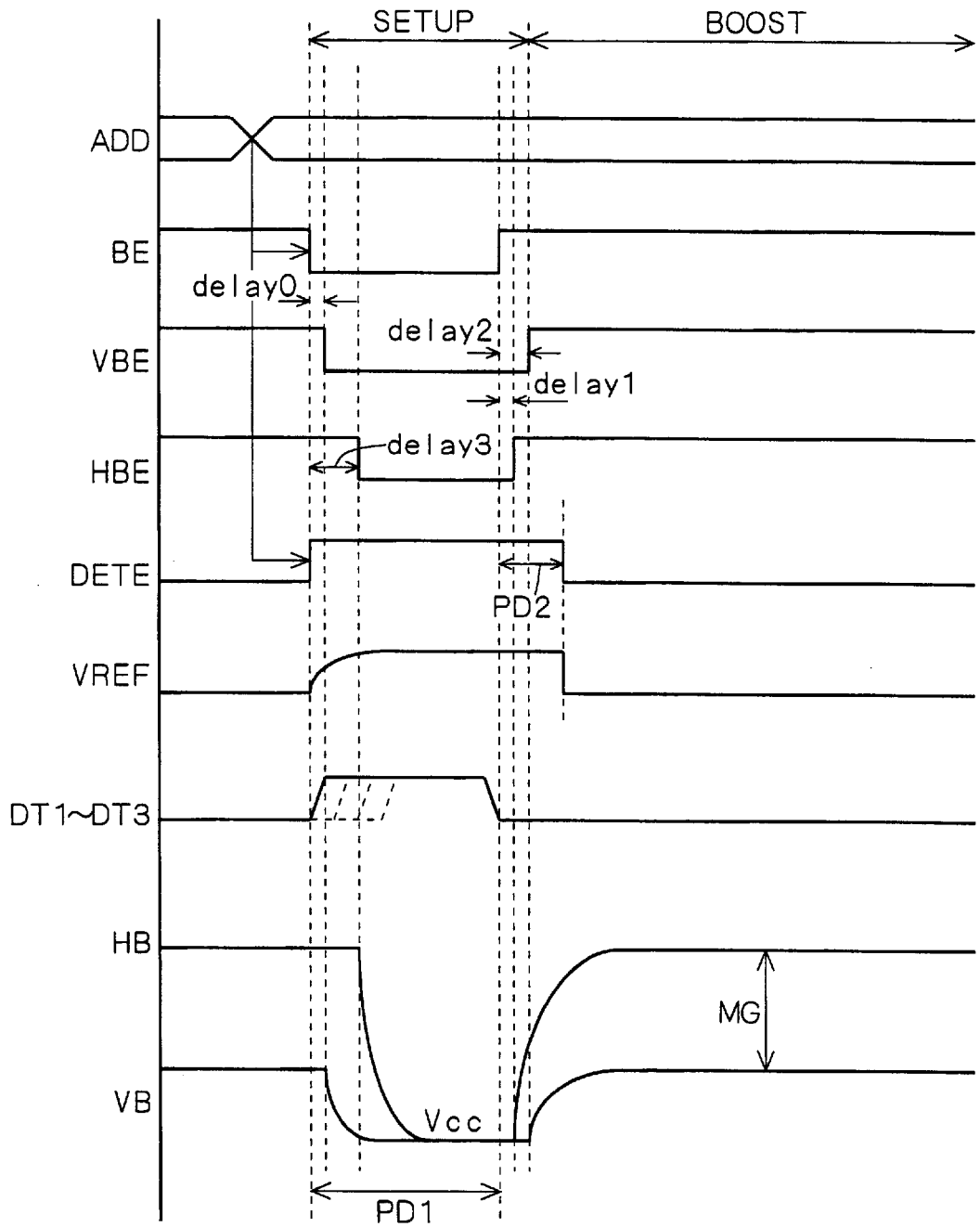
FIG. 5 is a timing chart showing operation of the word line boosting circuit of the first preferred embodiment.

Operation of the word line boosting circuit BCa is now described. FIG. 5 is a timing chart showing signal outputs from the individual parts.

Figure 35:
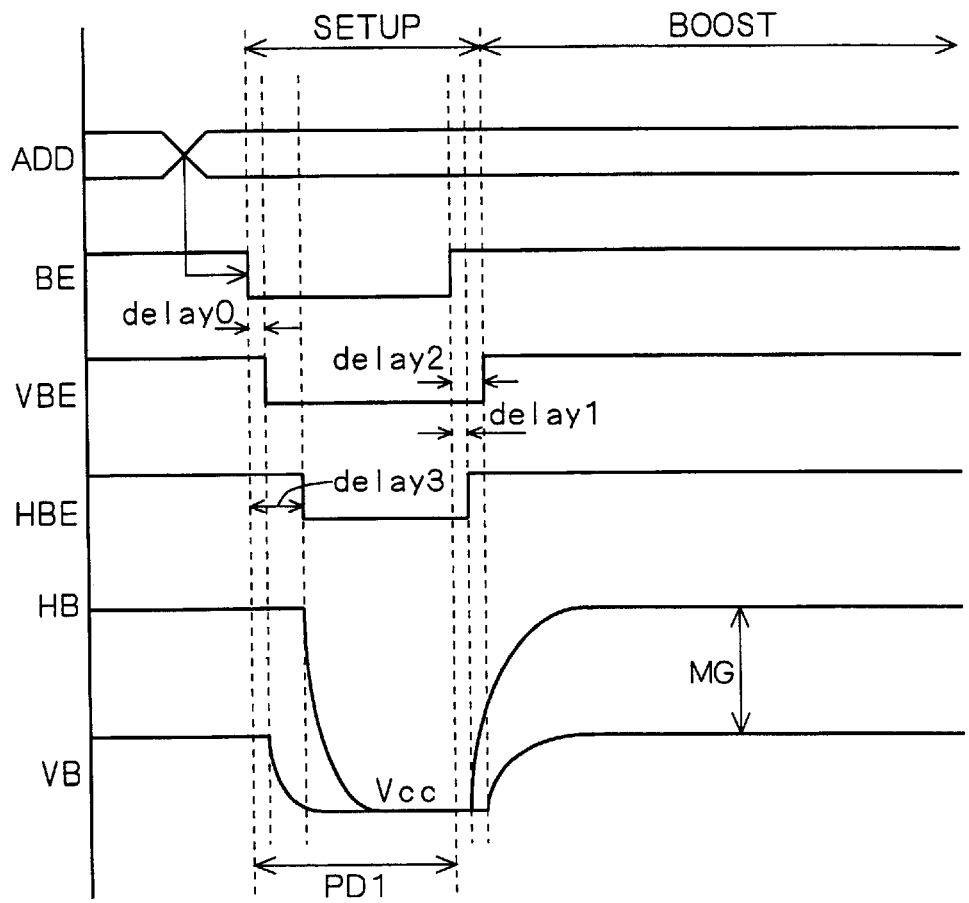
FIG. 35 is a timing chart showing operation of the conventional word line boosting circuit.
Figure 36:
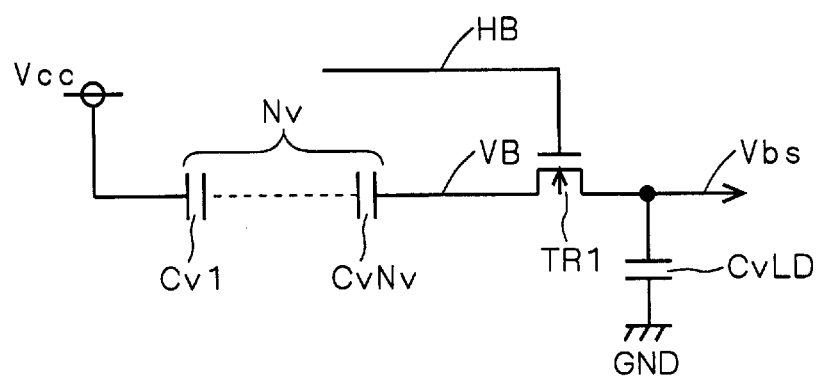
FIG. 36 is a diagram showing an equivalent circuit of the conventional word line boosting circuit in the boost period.

In the signal outputs, the boost enable signal BE, gate boost enable signal HBE and drain boost enable signal VBE vary as shown in the timing chart of FIG. 35, which are not described again here.

Signal variations in the boosting stages in the gate boosting circuit HCa, too, are the same as those in the conventional gate boosting circuit HCe, which are not described again here.

Signal variations in each boosting stage in the drain boosting circuit VCa are now described. First, the change of the drain boost enable signal VBE passes through the inverter Iv2 to change the inverse drain boost enable signal BVBE, which change is transferred to the boosting stages in the drain boosting circuit VCa. First, in the first stage SGv1a, the transistor N31 becomes conductive and gives the ground voltage GND to the first end of the capacitor C3a.

Further, the transistor N32 becomes conductive and gives the ground voltage GND to the gate of the transistor P33. When the transistor P33 becomes conductive, the power-supply voltage Vcc is given to the second end of the capacitor C3a. The capacitor C3a is thus charged.

During the setup period, all of the switch circuits SW1a to SW1c connect their first ends to the ground voltage GND. Accordingly the first ends of the capacitors C3b to C3d are connected to the ground voltage GND, and the power-supply voltage Vcc is given to their second ends, whereby the capacitors C3b to C3d are charged.

When the transistor P33 becomes conductive, the power-supply voltage Vcc is given as the output Voutc of the first stage SGv1a. Then the input Vinb of the next stage SGv2a becomes equal to the power-supply voltage Vcc. Like the capacitor C3a, the capacitor C4a too receives the ground voltage GND at its first end and the power-supply voltage Vcc at its second end. The capacitor C4a is thus charged.

During the setup period, all of the switch circuits SW2a to SW2c connect their first ends to the ground voltage GND. Accordingly the first ends of the capacitors C4b to C4d are connected to the ground voltage GND and the power-supply voltage Vcc is given to their second ends, whereby the capacitors C4b to C4d are charged.

The same takes place also in the following boosting stage SGv3a and the capacitors in the stages are thus charged. Therefore the power-supply voltage Vcc appears at the output VB of the drain boosting circuit VCa at this time. FIG. 5 shows that the output VB of the drain boosting circuit VCa and the output HB of the gate boosting circuit HCa are brought back to the power-supply voltage Vcc during the setup period.

Then, the change of the drain boost enable signal VBE passes through the inverter Iv2 and changes the inverse drain boost enable signal BVBE, which change is transferred to the boosting stages in the drain boosting circuit VCa. First, in the first stage SGv1a, the transistor P32 becomes conductive and the transistor P33 turns off, and the potential at the second ends of the capacitors C3a to C3d go in a floating state. Since the capacitors C3a to C3d were being charged till a moment before, the voltage Vcc is occurring at both ends thereof.

The transistor P31 becomes conductive and the power-supply voltage Vcc is given to the first end of the capacitor C3a. Then the voltage at the second end of the capacitor C3a in the floating state becomes 2Vcc.

If at least one of the switch circuits SW1a to SW1c, which were previously connected to the ground voltage GND, changes its connection from the ground voltage GND to the power-supply voltage Vcc in accordance with the change of the inverse drain boost enable signal BVBE, the voltage at the second end of the corresponding capacitor becomes 2Vcc, too.

If the remaining switch circuits disconnect from the ground voltage GND in response to the change of the inverse drain boost enable signal BVBE and go into the floating state, then the output Voutc of the first stage SGv1a becomes 2Vcc.

The input Vinb of the next stage SGv2a becomes 2Vcc, and the voltage Vcc is occurring at both ends of the capacitors C4a to C4d, as in the capacitors in the previous stage. The switch circuits SW2a to SW2c operate like the switch circuits SW1a to SW1c, and the output Voutd of the second stage SGv2a becomes 3Vcc.

The same occurs in the next boosting stage SGv3a and the voltage is thus boosted in each stage. Therefore a voltage of 4Vcc, which has been boosted four times the power-supply voltage Vcc, appears at the output VB of the drain boosting circuit VCa. This is the value obtained in the case where the transistor TR1 is off. When the transistor TR1 is on, redistribution of charge occurs between the capacitance of the drain boosting circuit VCa and the capacitance of the load connected to the source of the transistor TR1, so that the voltage value appearing as the output VB is not always 4Vcc. As stated before, it is desired that the value of the output HB be boosted more with a sufficient margin MG than the value of the output VB. Also as stated before, the value of the margin MG can be about 1.5 V or more, for example The voltage applied to the load connected to the source of the transistor TR1 when the transistor TR1 conducts differs from that in the conventional word line boosting circuit BCe. That is to say, in the word line boosting circuit BCa of this preferred embodiment, charges stored not only in the capacitors C3a and C4a but also in at least one of the capacitors C3b to C3d and at least one of the capacitors C4b to C4d may be transferred to the following stage. Accordingly, in such cases, when the transistor TR1 becomes conductive and the charge is transferred to the load connected to the source of the transistor TR1, the voltage appearing between both ends of the load varies depending on how many of the capacitors C3b to C3d, and the capacitors C4b to C4d, are connected.

This results from the fact that the capacitors C3a to C3d and capacitors C4a to C4d are parallel-connected and the value of their composite capacitance is variable. Thus, in this preferred embodiment, the value of Cvboost in Equation 5 varies depending on the number of parallel-connected capacitors in the capacitors C3a to C3d and the capacitors C4a to C4d. Accordingly, in the graph shown in FIG. 37, the gradient varies as the capacitance of the parallel-connected capacitors varies.

Figure 6:
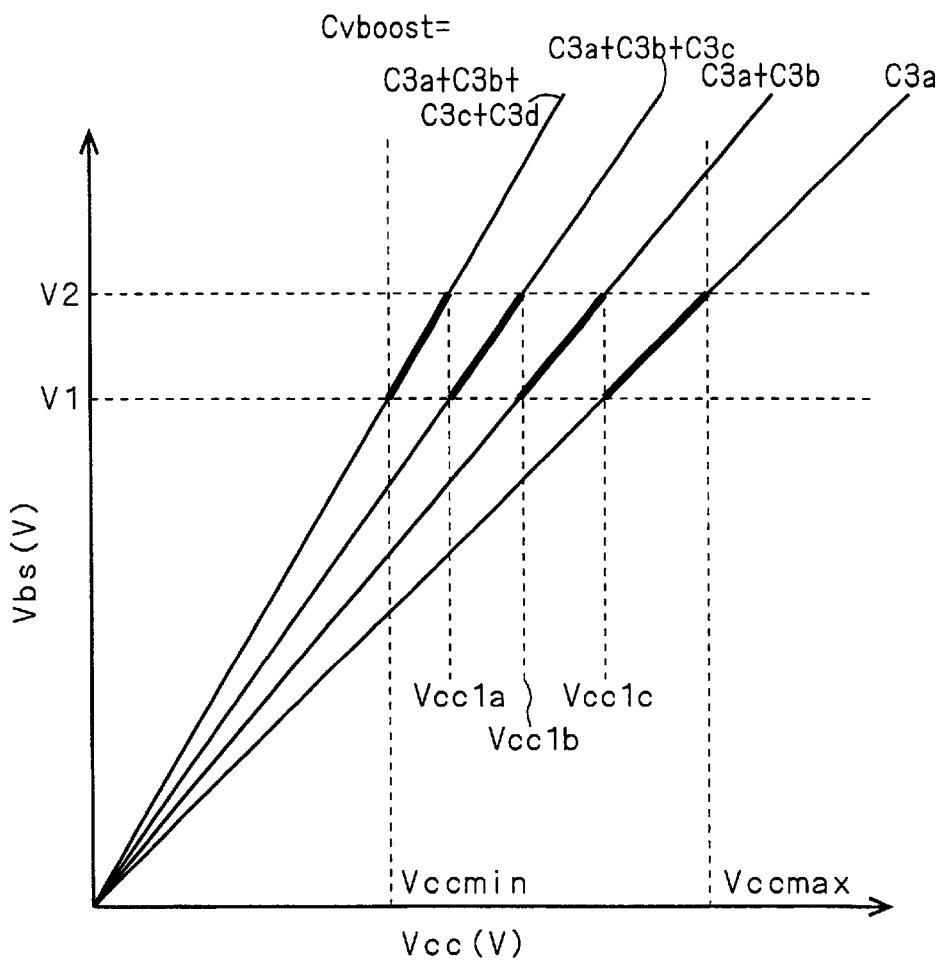
FIGS. 6 is a diagram showing the relation between the boosted voltage and the power-supply voltage in the word line boosting circuit of the first preferred embodiment.

FIG. 6 is a graph about Equation 5 in this preferred embodiment. As shown in FIG. 6, the value of Cvboost increases as a larger number of capacitors are parallel-connected among the capacitors C3a to C3d and the capacitors C4a to C4d, which makes the gradient of the graph steeper.

Accordingly, as shown in FIG. 6, the configuration is set so that when only the capacitor C3a, and the capacitor C4a, are connected, the graph passes the lower limit value V2 of the threshold voltage distribution at the upper limit Vccmax of the power-supply voltage Vcc, for example. Further, at the value Vcc1c of the power-supply voltage Vcc at which that graph passes the upper limit value V1 of the threshold voltage distribution, the graph obtained when the capacitors C3a and C3b, and the capacitors C4a and C4b, are parallel-connected passes the lower limit value V2 of the threshold voltage distribution.

Similarly, when the capacitors C3a to C3c, and the capacitors C4a to C4c, are parallel-connected, the graph passes the lower limit value V2 at the value Vcc1b of the power-supply voltage Vcc, and when all of the capacitors C3a to C3d, and the capacitors C4a to C4d, are parallel-connected, the graph passes the lower limit value V2 at the value Vcc1a of the power-supply voltage Vcc.

These graph characteristics are realized by appropriately setting the various parameters in Equation 5 and the capacitance value of the capacitors C3a to C3d and C4a to C4d.

In this way, by adopting the parts of the graphs which are within the range between the upper limit value V1 and the lower limit value V2 of the threshold voltage distribution, power-supply voltages of various magnitudes can be used while having the boosted voltage Vbs fall within the range between the upper limit value V1 and the lower limit value V2.

A more variety of power-supply voltages can be used by adding some more parallel-connected capacitors, in addition to the capacitors C3a to C3d and the capacitors C4a and C4d. In FIG. 6, when all of the capacitors C3a to C3d and the capacitors C4a to C4d are parallel-connected, the graph just passes the upper limit value V1 of the threshold voltage distribution at the lower limit Vccmin of the power-supply voltage Vcc. However, it is not essential to cause the graph to just pass the upper limit value V1 of the threshold voltage distribution. When the lower limit Vccmin is still lower, the number of parallel-connected capacitors may be increased to add an additional graph or graphs.

For example, numerical examples of the upper limit Vccmax and lower limit Vccmin of the power-supply voltage Vcc in the graph of FIG. 6 are 3.9 V and 2.5 V, respectively, and numerical examples of the values Vcc1a, Vcc1b and Vcc1c of the power-supply voltage Vcc are 2.8 V, 3.1 V and 3.5 V, respectively.

In order to realize the operation described above, the switch circuits SW1a to SW1c and SW2a to SW2c must appropriately operate in accordance with the value of the inverse drain boost enable signal BVBE and the value of the power-supply voltage Vcc. For this purpose, the power-supply voltage detecting portion DE1 must detect the power-supply voltage Vcc and appropriately output the operation signals S1a to S3a for controlling the switch circuits SW1a to SW1c and SW2a to SW2c.

First, operation of the power-supply voltage detecting portion DE1 is described. The detect enable signal DETE becomes active (e.g. high-active) in response to the ATD signal generated as the address signal ADD varies in reading of the stored contents.

The detect enable signal DETE is set to become inactive after a slight delay following the activation of the boost enable signal BE. In FIG. 5, it becomes inactive after a delay of period PD2. Then the transistor TR2 and the reference voltage generating circuit VR are turned off after the setup period has ended, which prevents wasteful consumption of power. Even if the power-supply voltage Vcc varies after the setup period, the value of the power-supply voltage Vcc detected during the setup period can be used as a reference value for the time being. This is effective when the power-supply voltage Vcc frequently varies, for example. Specifically, the period PD2 is about 3 ns, for example.

When the detect enable signal DETE becomes active, the reference voltage generating circuit VR generates the reference voltage VREF. The transistor TR2 becomes conductive. In FIG. 5, in order to show that the generation of the reference voltage VREF takes a certain time, the reference voltage VREF is expressed as a gradually increasing waveform. Specifically, the reference voltage VREF is about 1.2 V, for example.

As the transistor TR2 becomes conductive, the power-supply voltage Vcc is divided by the resistors R1 to R4 and appears at the second ends of the resistors R1 to R3 as values decreasing in steps. Then the comparator OP1 compares the voltage appearing at the second end of the resistor R1 with the reference voltage VREF, and its output becomes active (e.g. high-active) when the voltage appearing at the second end of the resistor R1 is larger than the reference voltage VREF.

Similarly, the comparator OP2 compares the voltage appearing at the second end of the resistor R2 with the reference voltage VREF and the comparator OP3 compares the voltage appearing at the second end of the resistor R3 with the reference voltage VREF. The output of the comparator OP2 becomes active when the voltage appearing at the second end of the resistor R2 is larger than the reference voltage VREF and the output of the comparator OP3 becomes active when the voltage appearing at the second end of the resistor R3 is larger than the reference voltage VREF (like the output of the comparator OP1, the outputs of the comparators OP2 and OP3 are both high-active, for example).

As the boost enable signal BE becomes inactive in response to the ATD signal (as in the conventional word line boosting circuit BCe, the boost enable signal BE is high-active, for example), the transfer gates TG1 to TG3 all transfer the outputs from the comparators OP1 to OP3 as the outputs DT1 to DT3 to the latch circuits LH1 to LH3, respectively. FIG. 5 shows the activation of the outputs DT1 to DT3 as if it occurs approximately at the same time as the inactivation of the boost enable signal BE. Actually, however, generation of the reference voltage VREF takes a certain time, so that the activation of the outputs DT1 to DT3 is slightly delayed behind the inactivation of the boost enable signal BE, as shown by the broken lines in FIG. 5.

Now, the latch circuits LH1 to LH3 hold information of the outputs DT1 to DT3. Their outputs L1 to L3 are all inputted to the decoder DCa. The decoder DCa generates the operation signals S1a to S3a in accordance with the combination of active and inactive of the outputs L1 to L3.

The relation between the outputs of the comparators OP1 to OP3 and the power-supply voltage Vcc is now described. At the second ends of the resistors R1 to R3, the power-supply voltage Vcc divided by the resistors R1 to R4 appear as values decreasing in steps, so that the voltage appearing at the second end of the resistor R1 is the closest to the power-supply voltage Vcc. The voltage appearing at the second end of the resistor R2 is the second closest to the power-supply voltage Vcc (a value smaller than the voltage appearing at the second end of the resistor R1), and the voltage appearing at the second end of the resistor R3 is the furthest from the power-supply voltage Vcc (a value smaller than the voltage appearing at the second end of the resistor R2).

Now, since the reference voltage VREF is constant, the voltages appearing at the second ends of the resistors R1 to R3 are all larger than the reference voltage VREF when the power-supply voltage Vcc is sufficiently large, and the outputs of the comparators OP1 to OP3 are all active. On the other hand, when the power-supply voltage Vcc is sufficiently small, the voltages appearing at the second ends of the resistors R1 to R3 are all smaller than the reference voltage VREF and the outputs of the comparators OP1 to OP3 are all inactive. When the power-supply voltage Vcc is large to a certain extent, the voltages appearing at the second ends of the resistors R1 and R2 are larger than the reference voltage VREF and the outputs of the comparators OP1 and OP2 are both active. When the power-supply voltage Vcc is small to a certain extent, the voltage appearing at the second end of the resistor R1 is larger than the reference voltage VREF and the output of the comparator OP1 is active.

This can be summarized as shown in Table 1 below.

TABLE 1

| Vcc | L1 | L2 | L3 | S1a | S2a | S3a |
|---|---|---|---|---|---|---|
| Vcc1a or smaller | L | L | L | L | L | L |
| Vcc1a - Vcc1b | H | L | L | L | L | H |
| Vcc1b - Vcc1c | H | H | L | L | H | H |
| Vcc1c or larger | H | H | H | H | H | H |

It is assumed in Table 1 that the resistors R1 to R4 divide the value of the power-supply voltage Vcc into Vcc1a, Vcc1b and Vcc1c (Vcc1a<Vcc1b<Vcc1c). Vcc1a to Vcc1c correspond to those described about FIG. 6.

While Table 1 shows combinations of active (high) and inactive (low) of the outputs L1 to L3 of the latch circuits LH1 to LH3, the values are the same as the outputs from the comparators OP1 to OP3, which can be considered equal. Table 1 also shows combinations of the operation signals S1a to S3a to be provided as the outputs. The operation signals S1a to S3a, when at low, parallel-connect the corresponding capacitors to the capacitor C3a or C4a, and when at high, do not parallel-connect the corresponding capacitors.

Figure 7:
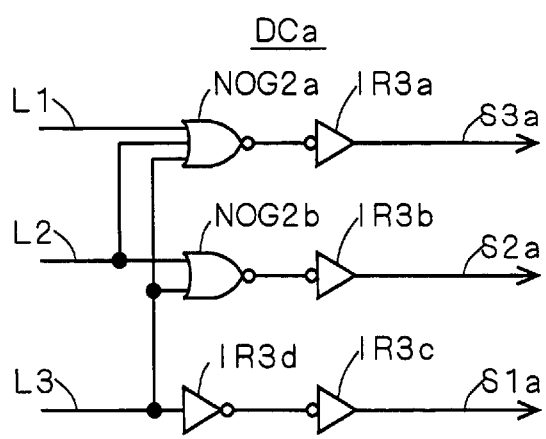
FIGS. 7 and 8 are diagrams showing parts of the word line boosting circuit of the first preferred embodiment.

For the configuration of the decoder DCa for generating the operation signals S1a to S3a as shown in Table 1, the circuit configuration shown in FIG. 7 is an example. In FIG. 7, the decoder DCa has NOR gates NOG2a and NOG2b and inverters IR3a to IR3d, where the NOR gate NOG2a receives the outputs L1 to L3 of the latch circuits LH1 to LH3 at its input ends. The NOR gate NOG2b receives at its input ends the outputs L2 and L3 from the latch circuits LH2 and LH3. The inverter IR3d receives the output L3 of the latch circuit LH3 at its input end.

The output of the NOR gate NOG2a is inputted to the inverter IR3a and the output of the inverter IR3a forms the operation signal S3a. The output of the NOR gate NOG2b is inputted to the inverter IR3b and the output of the inverter IR3b forms the operation signal S2a. The output of the inverter IR3d is inputted to the inverter IR3c and the output of the inverter IR3c forms the operation signal S1a.

Figure 8:
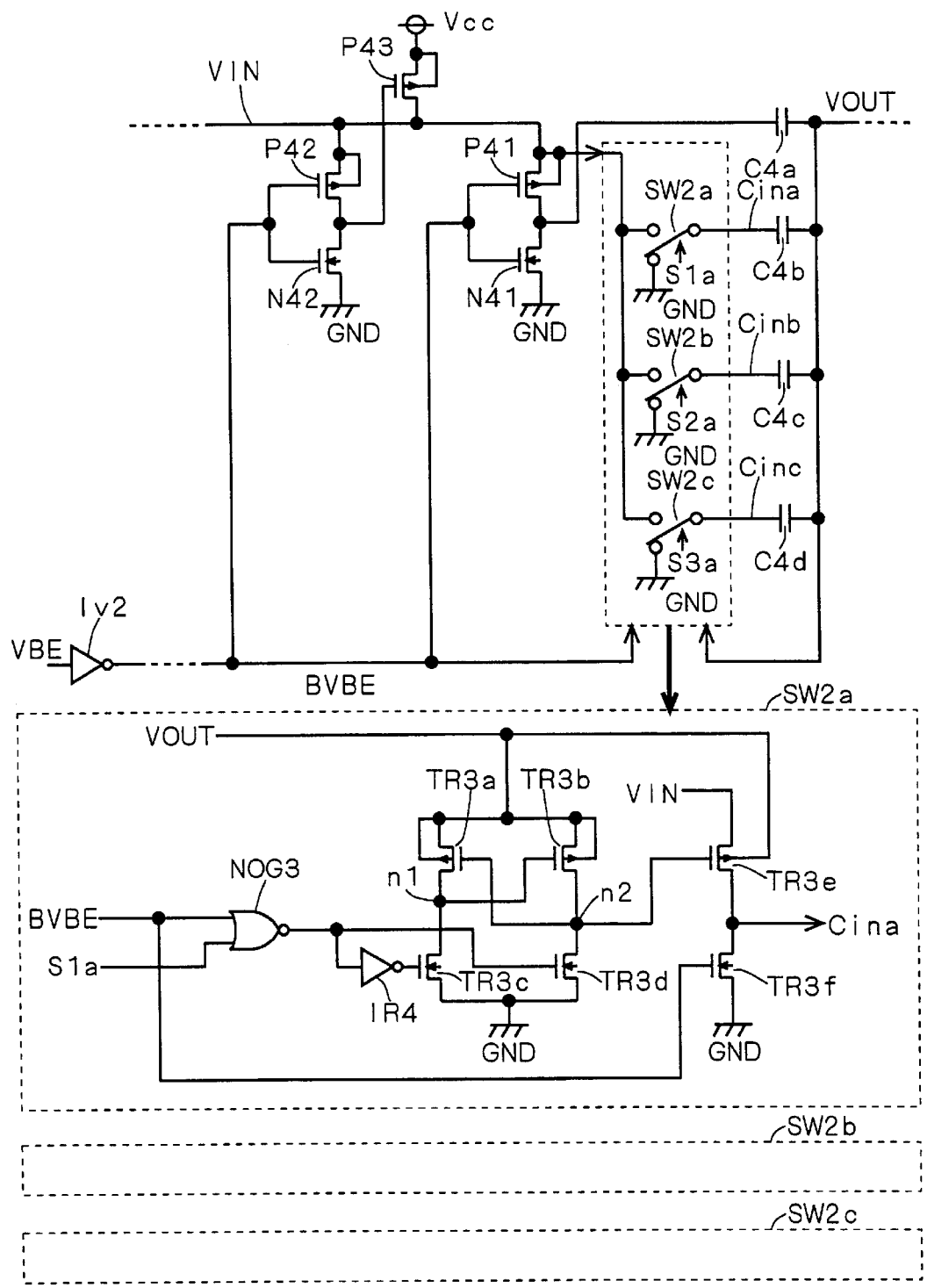

FIG. 8 shows an example of the configuration of the switch circuits SW2a to SW2c which can vary the number of parallel-connected capacitors among the capacitors C3a to C3d and the capacitors C4a to C4d in accordance with the inverse drain boost enable signal BVBE and the operation signals S1a to S3a. For simplicity, the diagram does not show the configuration of the switch circuits SW2b and SW2c.

The switch circuit SW2a has P-channel MOS transistors TR3a, TR3b and TR3e, N-channel MOS transistors TR3c, TR3d and TR3f, a NOR gate NOG3 and an inverter IR4.

First, the NOR gate NOG3 receives the inverse drain boost enable signal BVBE and the operation signal S1a. The output of the NOR gate NOG3 is inputted to the gate of the transistor TR3d and to the inverter IR4. The output of the inverter IR4 is inputted to the gate of the transistor TR3c. The source of the transistor TR3c and the source of the transistor TR3d are connected to each other and are supplied with the ground voltage GND.

The source of the transistor TR3a is connected to the source of the transistor TR3b and the output VOUT of that boosting stage is applied thereto. The node n1, or the drain of the transistor TR3a, is connected to the drain of the transistor TR3c and the gate of the transistor TR3b. The node n2, or the drain of the transistor TR3b, is connected to the drain of the transistor TR3d and the gate of the transistor TR3a. The node n2 is connected also to the gate of the transistor TR3e.

The source of the transistor TR3e receives the input VIN to that boosting stage. The drain of the transistor TR3e is connected to the drain of the transistor TR3f. The source of the transistor TR3f is supplied with the ground voltage GND and the gate of the transistor TR3f is supplied with the inverse drain boost enable signal BVBE. The voltage Cina at the drain of the transistor TR3e is applied to the first end of the capacitor C4b.

The output VOUT of that boosting stage is applied to the bodies of the transistors TR3a, TR3b and TR3e.

The circuit thus constructed is called CVSL (Cascode Voltage Switch Logic) circuit. The operation of this circuit is described.

First, when the inverse drain boost enable signal BVBE is high (i.e. in the setup period), the transistor TR3f is conducting and the voltage Cina is at the ground voltage GND, which grounds the first end of the capacitor C4b.

When the inverse drain boost enable signal BVBE is low (i.e. in the boost period), the operation of this circuit varies depending on whether the operation signal S1a is high or low.

First, when the operation signal S1a is high (inactive), the output of the NOR gate NOG3 is low and the transistor TR3c becomes conductive through the inverter IR4. Then the voltage at the node n1 becomes the ground voltage GND. The transistor TR3b, too, becomes conductive, which causes the voltage at the node n2 to reach the output VOUT. When the voltage at the node n2 becomes equal to the output VOUT, the transistor TR3e does not conduct. This is because the voltage at the source of the transistor TR3e is the input VIN to that boosting stage and the value of the input VIN is lower than the output VOUT of that boosting stage.

Since the output VOUT is applied also to the body of the transistor TR3e, the voltage at the body becomes higher than the voltage at the source. Then, due to the threshold bias effect of the body voltage, the threshold between the source and gate of the transistor TR3e becomes larger in the negative direction. Therefore the transistor TR3e becomes further unlikely to conduct.

Figure 9:
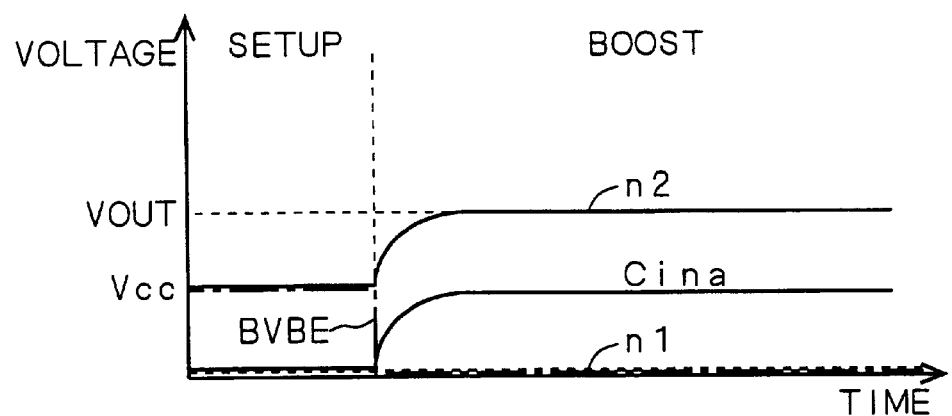
FIGS. 9 and 10 are timing charts showing operation of the word line boosting circuit of the first preferred embodiment.

Therefore the voltage Cina does not become equal to the input VIN to that boosting stage, in which case the capacitor C4b is not parallel-connected to the capacitor C4a. Now, the transistor TR3f does not conduct, either, so that the voltage Cina goes in a floating state. Therefore the charge charged in the setup period is not wastefully released. FIG. 9 shows variations at the nodes n1 and n2 and of the voltage Cina at this time.

Figure 10:
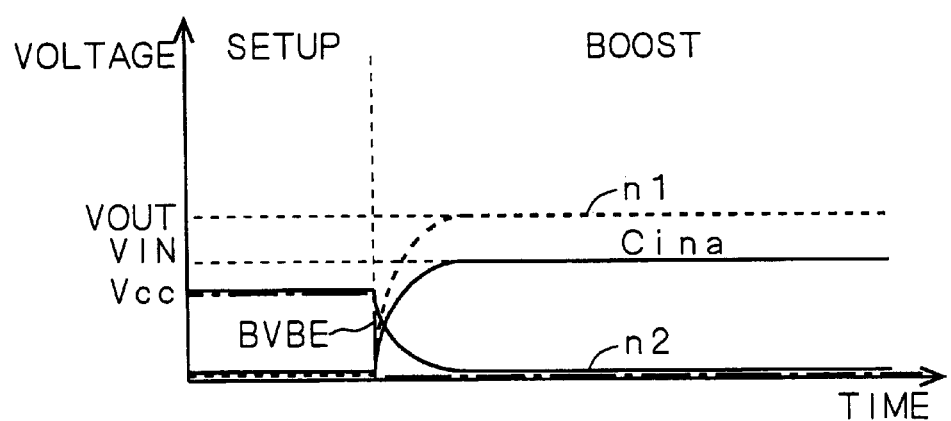

When the operation signal S1a is low (active), the output of the NOR gate NOG3 is high and the transistor TR3d becomes conductive. Then the voltage at the node n2 becomes equal to the ground voltage GND. The transistor TR3a becomes conductive and the voltage at the node n1 then becomes equal to the output voltage VOUT. When the voltage at the node n2 reaches the ground voltage GND, the transistor TR3e becomes conductive. Therefore the voltage Cina reaches the input VIN of that boosting stage, in which case the capacitor C4b is parallel-connected to the capacitor C4a. FIG. 10 shows the variations at the nodes n1 and n2 and of the voltage Cina.

The switch circuits SW2b and SW2c are also constructed as above, where the switch circuit SW2b receives the operation signal S2a in place of the operation signal S1a and outputs the voltage Cinb in place of the voltage Cina. The switch circuit SW2c receives the operation signal S3a in place of the operation signal S1a and outputs the voltage Cinc in place of the voltage Cina.

Further, the switch circuits SW1a to SW1c are also constructed as shown in the configuration example of the switch circuits SW2a to SW2c, where each circuit receives a corresponding operation signal in place of the operation signal S1a and provides a corresponding output signal in place of the output signal Cina.

With the switch circuits SW2a to SW2c and SW1a to SW1c constructed as above, the number of parallel-connected capacitors among the capacitors C3a to C3d and the capacitors C4a to C4d can be appropriately varied in accordance with the inverse drain boost enable signal BVBE and the operation signals S1a to S3a.

The word line boosting circuit according to this preferred embodiment can vary the number of parallel-connected capacitors among the capacitors C3a to C3d and the capacitors C4a to C4d in the drain boosting circuit in accordance with the value of the power-supply voltage Vcc, so as to vary the voltage applied to the load connected to the source of the transistor TR1. Therefore power-supply voltages in a wide range of magnitudes can be used while generating the boosted voltage Vbs within the range between the upper limit value V1 and the lower limit value V2 of the threshold voltage distribution of the semiconductor non-volatile memory elements.

Second Preferred Embodiment

This preferred embodiment, too, realizes a word line boosting circuit which can vary the voltage applied to a load connected to the source of the transistors TR4a–TR4c in accordance with the value of the power-supply voltage Vcc so that the boosted voltage Vbs falls within the range between the upper limit value V1 and the lower limit value V2 of the threshold voltage distribution of semiconductor non-volatile memory elements, whereby power-supply voltages in a wide range of magnitudes can be used.

However, unlike the word line boosting circuit BCa of the first preferred embodiment, the word line boosting circuit of this preferred embodiment varies the voltage applied to the load by changing the point from which a boosted voltage is extracted; the number of capacitors in each boosting stage is unchanged, as in the conventional word line boosting circuit BCe.

Figure 11:
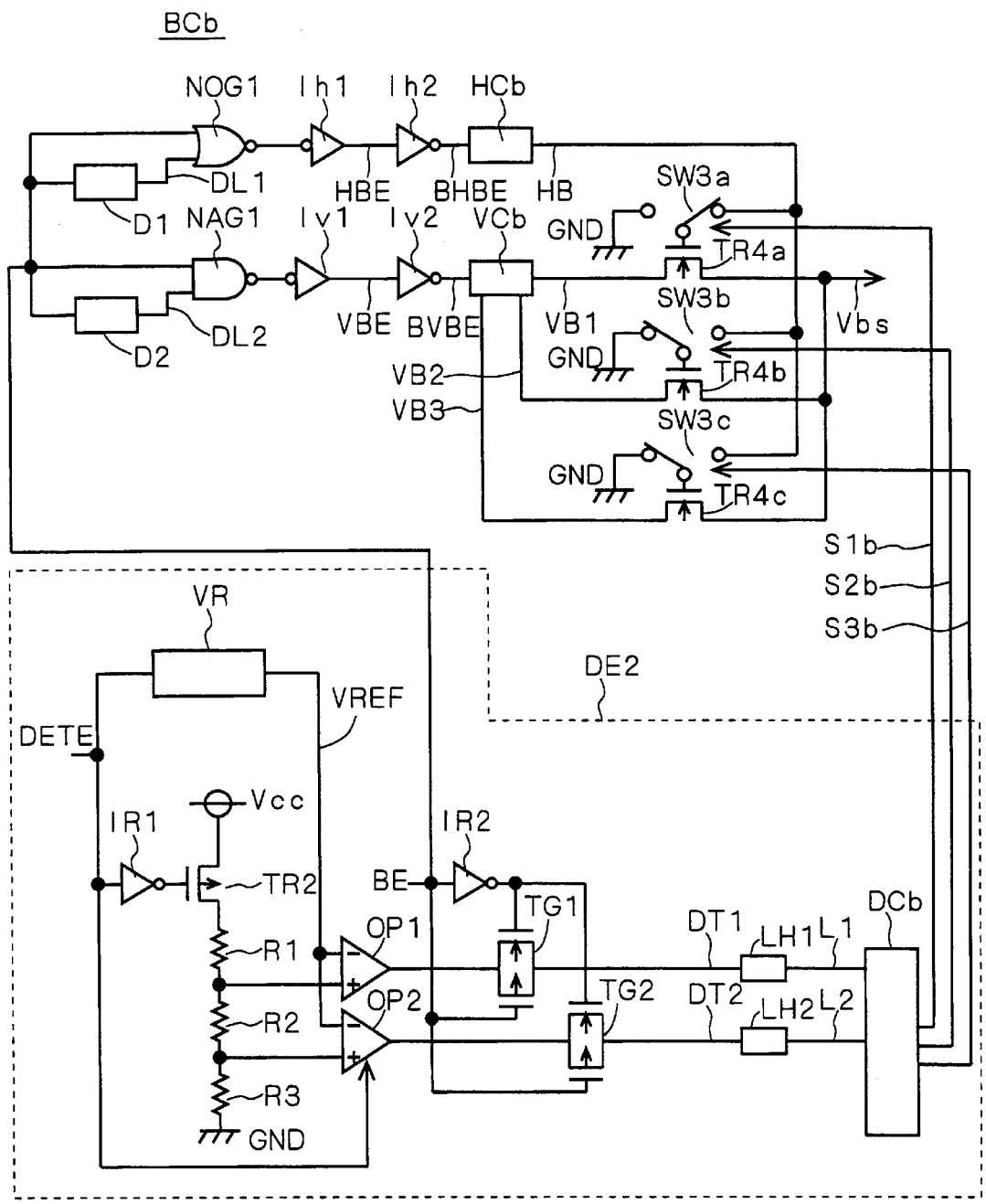
FIG. 11 is a diagram showing a word line boosting circuit according to a second preferred embodiment.

FIG. 11 is a diagram showing a word line boosting circuit BCb of this preferred embodiment. In FIG. 11, elements having the same functions as those in the word line boosting circuit BCa of the first preferred embodiment are shown at the same reference characters. As shown in FIG. 11, this word line boosting circuit BCb has a gate boosting circuit HCb and a drain boosting circuit VCb in place of the gate boosting circuit HCa and the drain boosting circuit VCa in the word line boosting circuit BCa.

The gate boosting circuit HCb boosts the power-supply voltage Vcc to provide the output HB and the drain boosting circuit VCb boosts the power-supply voltage Vcc to provide outputs VB1 to VB3.

The word line boosting circuit BCb further has, in place of the transistor TR1, N-channel MOS transistors TR4a to TR4c whose drains receive the outputs VB1 to VB3, respectively. The gates of the transistors TR4a to TR4c are supplied with the output HB from the gate boosting circuit HCb or the ground voltage GND through switch circuits SW3a to SW3c, respectively. As will be explained later, the output HB of the gate boosting circuit HCb is applied to one of the transistors TR4a to TR4c and the ground voltage GND is applied to the remaining two transistors.

The sources of the transistors TR4a to TR4c are connected in common and the boosted voltage Vbs is outputted from one of the sources.

The word line boosting circuit BCb further has a power-supply voltage detecting portion DE2 instead of the power-supply voltage detecting portion DE1. The power-supply voltage detecting portion DE2 resistor-divides the power-supply voltage into two, instead of three. Therefore the resistor R4, comparator OP3, transfer gate TG3 and latch circuit LH3 are removed. It has a decoder DCb, instead of the decoder DCa, to output operation signals S1b to S3b.

Figure 12:
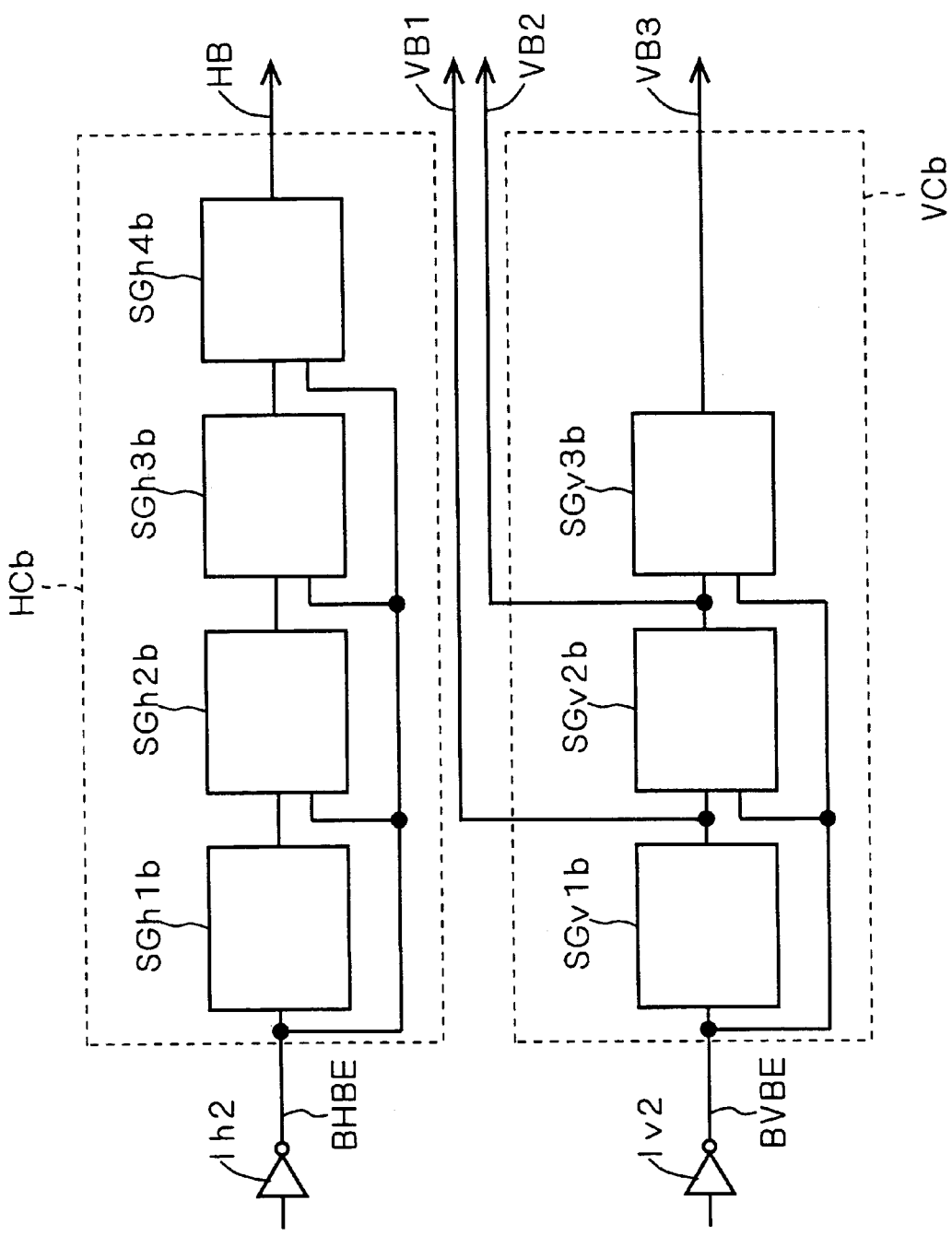
FIG. 12 is a diagram showing part of the word line boosting circuit of the second preferred embodiment.

The gate boosting circuit HCb and the drain boosting circuit VCb have structures as shown in FIG. 12. That is to say, the gate boosting circuit HCb has a plurality of boosting stages SGh1b to SGh4b connected in series, where the first boosting stage SGh1b receives the inverse gate boost enable signal BHBE from the inverter Ih2 and the final boosting stage SGh4b generates the output HB. Although this example shows four boosting stages, it may include a larger or a smaller number of stages.

The drain boosting circuit VCb includes a plurality of boosting stages SGv1b to SGv3b connected in series, where the first boosting stage SGv1b receives the inverse drain boost enable signal BVBE from the inverter Iv2. The first boosting stage SGv1b generates the output VB1 and the next boosting stage SGv2b generates the output VB2. The final boosting stage SGv3b generates the output VB3.

Although this example shows three boosting stages, it may include a larger or a smaller number of stages. However, note that it is preferred that the gate boosting circuit HCb has a slightly larger number of boosting stages than the drain boosting circuit VCb, for the same reason described about the conventional drain boosting circuit VCe.

In the gate boosting circuit HCb, while the first boosting stage SGh1b receives only the inverse gate boost enable signal BHBE, the next and following boosting stages SGh2b to SGh4b receive the inverse gate boost enable signal BHBE and also an output from the preceding stage, and they each boost the output from the preceding stage using the inverse gate boost enable signal BHBE. Similarly, in the drain boosting circuit VCb, the first boosting stage SGv1b receives only the inverse drain boost enable signal BVBE, but the next and following boosting stages SGv2b and SGv3b receive the inverse drain boost enable signal BVBE and also an output from the preceding stage, and they each boost the output from the preceding stage using the inverse drain boost enable signal BVBE.

The structures of the boosting stages are now described. The boosting stages in the gate boosting circuit HCb adopt the unit boosting stages SGa and SGb shown in FIGS. 33 and 34. Therefore the gate boosting circuit HCb has the same structure as the conventional gate boosting circuit HCe, which is not described again here.

Figure 33:
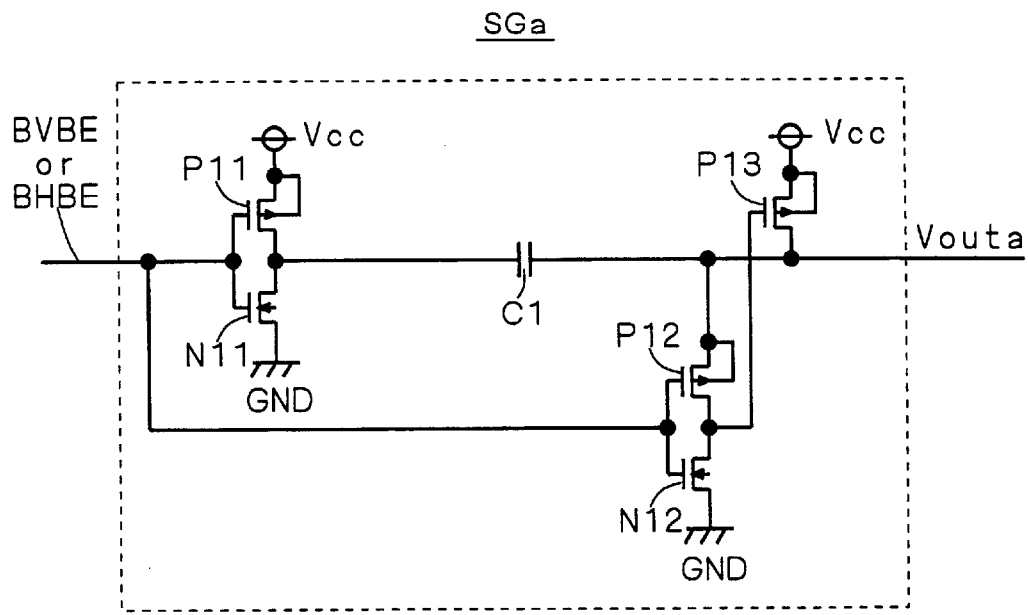
Figure 34:
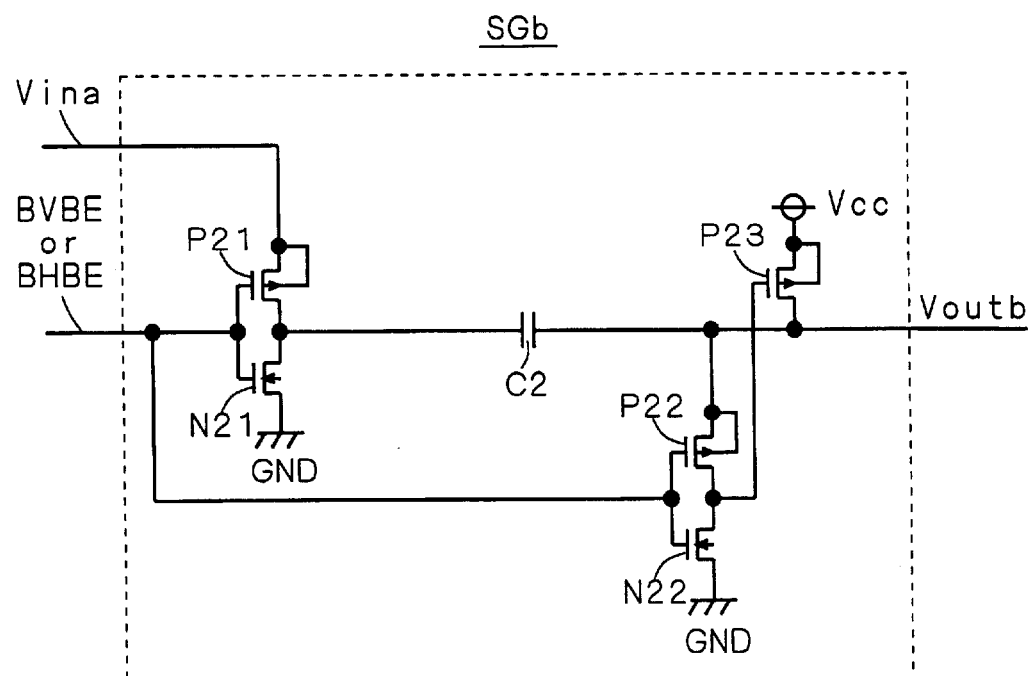

The boosting stages in the drain boosting circuit VCb also adopt the unit boosting stages SGa and SGb shown in FIGS. 33 and 34. Therefore the drain boosting circuit VCb, too, has the same structure as the conventional drain boosting circuit VCe, which is not described again here.

Operation of this word line boosting circuit BCb is now described. In the operation of the word line boosting circuit BCb, the boost enable signal BE, gate boost enable signal HBE, drain boost enable signal VBE, detect enable signal DETE, reference voltage VREF, and outputs DT1 and DT2 of the transfer gates TG1 and TG2 vary as shown in the timing chart of FIG. 5, which are not described here again.

In the boosting stages in the gate boosting circuit HCb and the drain boosting circuit VCb, the signals vary in the same way as those in the conventional gate boosting circuit HCe and drain boosting circuit VCe, which are not described here again.

In this word line boosting circuit BCb, the output VB1 is extracted from the first boosting stage SGv1b, the output VB2 from the second boosting stage SGv2b, and the output VB3 from the final boosting stage SGv3b. In the boost period, the output VB1 becomes 2Vcc, the output VB2 becomes 3Vcc, and the output VB3 becomes 4Vcc, and one of the switch circuits SW3a to SW3c is connected to the output HB from the gate boosting circuit HCb to make one of the transistors TR4a to TR4c conduct, thus generating the boosted voltage Vbs.

Now, if the transistor TR4c is made conductive, the voltage applied to the load common-connected to the sources of the transistors is boosted as described in the word line boosting circuit BCe. When the transistor TR4b is made conductive, the voltage applied to the load common-connected to the sources of the transistors is boosted to a smaller value than when the transistor TR4c conducts, since the output VB2 has a smaller value than the output VB3. When the transistor TR4a is made conductive, the voltage applied to the load common-connected to the sources of the transistors is boosted to a smaller value than when the transistor TR4b conducts, since the output VB1 has a smaller value than the output VB2.

That is to say, this means that the value Nv in Equation 5 varies depending on from which boosting stage the output is extracted. Equation 5 can be modified as below using, in place of Nv, the number (ordinal number) Nva of the stage from which the output is extracted:

$$Vbs = \frac{Nva \cdot Cvload + (Nva + 1)Cvboost}{Nva \cdot Cvload + Cvboost} \cdot Vcc \qquad 6$$

Figure 37:
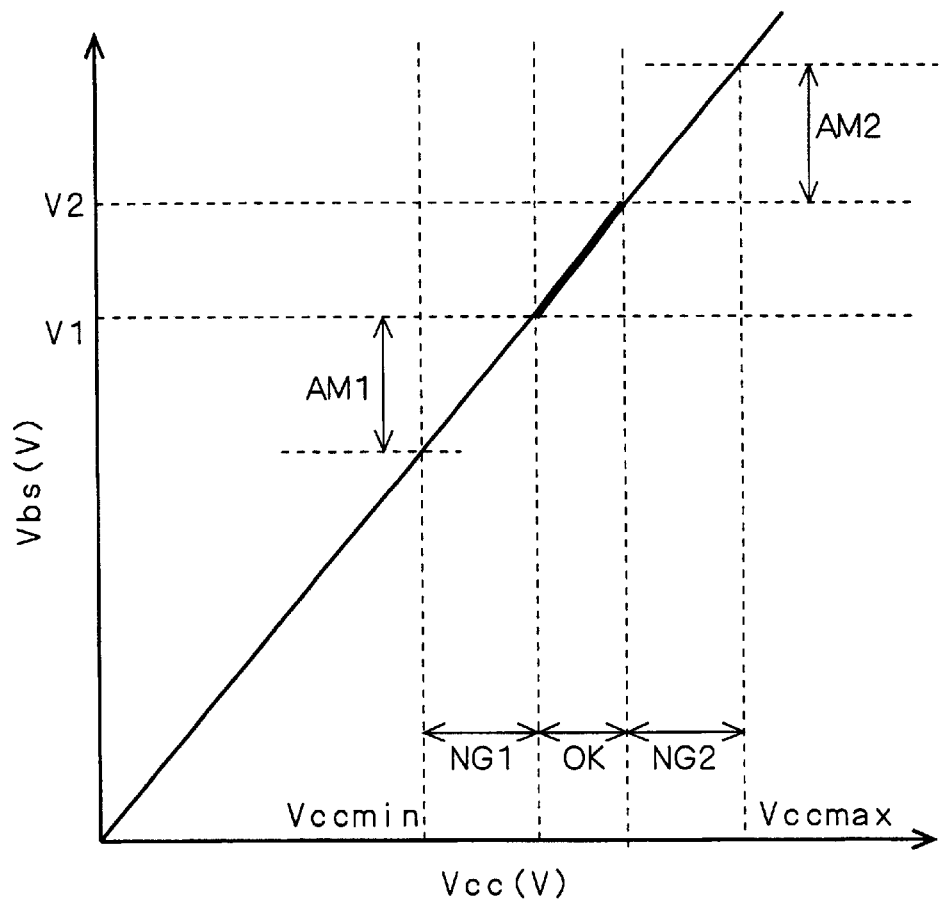
FIG. 37 is a diagram showing the relation between the boosted voltage and the power-supply voltage in the conventional word line boosting circuit.

Thus the gradient of the graphs shown in FIG. 37 varies depending on the number Nva of the stage from which the output is extracted. FIG. 13 is a graph about Equation 6 in this preferred embodiment. As shown in FIG. 13, the gradient of the graphs becomes steeper as the value Nva becomes larger, i.e. as the output is extracted from a latter stage.

For example, as shown in FIG. 13, the configuration is set so that, when the value Nva is one, i.e. when the output is extracted from the first stage, the graph passes the lower limit value V2 of the threshold voltage distribution at the upper limit Vccmax of the power-supply voltage Vcc. Further, at the value Vcc1b of the power-supply voltage Vcc at which that graph passes the upper limit value V1 of the threshold voltage distribution, the graph obtained when the value of Nva is two, i.e. when the output is extracted from the second stage, passes the lower limit value V2 of the threshold voltage distribution. Similarly, when the value of Nva is three, i.e. when the output is extracted from the third stage, the graph passes the lower limit value V2 at the value Vcc1a of the power-supply voltage Vcc.

These graph characteristics are realized by appropriately setting the various parameters in Equation 6.

In this way, by adopting the parts of the graphs which are within the range between the upper limit value V1 and the lower limit value V2 of the threshold voltage distribution, a wide range of power-supply voltages can be used while generating the boosted voltage Vbs within the range between the upper limit value V1 and the lower limit value V2.

A more variety of power-supply voltages can be used by providing a more variety of choice of Nva, i.e. by increasing the number of stages from which the output can be extracted. In FIG. 13, when Nva is three, or when the output is extracted from the third stage, the graph just passes the upper limit value V1 of the threshold voltage distribution at the lower limit Vccmin of the power-supply voltage Vcc. However, it is not essential to cause the graph to just pass the upper limit value V1 of the threshold voltage distribution. When the lower limit Vccmin is still lower, the number of stages may be increased to add an additional graph or graphs.

In order to realize the operation described above, the switch circuits SW3a to SW3c must appropriately operate in accordance with the value of the power-supply voltage Vcc. For this purpose, the power-supply voltage detecting portion DE2 must detect the power-supply voltage Vcc and appropriately output the operation signals S1b to S3b for controlling the switch circuits SW3a to SW3c.

Now, first, operation of the power-supply voltage detecting portion DE2 is described. The power-supply voltage detecting portion DE2 is the same as the power-supply voltage detecting portion DE1 except that it includes the decoder DCb in place of the decoder DCa and that the number of resistor-division of the power-supply voltage is reduced from three to two. Therefore it is described only briefly here.

First, when the detect enable signal DETE goes active (e.g. high-active) in response to the ATD signal, then the power-supply voltage Vcc is divided by the resistors R1 to R3 and appears at the second ends of the resistors R1 and R2 as values decreasing in steps. The comparators OP1 and OP2 respectively compare the voltages appearing at the second ends of the resistors R1 and R2 with the reference voltage VREF. Their outputs go active (e.g. high-active) when the voltages appearing at the second ends of the resistors R1 and R2 are larger than the reference voltage VREF.

Since the boost enable signal BE becomes inactive (e.g. high-active) in response to the ATD signal, the transfer gates TG1 and TG2 both transfer the outputs from the comparators OP1 and OP2 as the outputs DT1 and DT2 to the latch circuits LH1 and LH2.

The information of the outputs DT1 and DT2 is held in the latch circuits LH1 and LH2 and their outputs L1 and L2 are both inputted to the decoder DCb. The decoder DCb generates the operation signals S1b to S3b in accordance with the active-inactive combination of the outputs L1 and L2. The combinations are shown in Table 2 below.

TABLE 2

| Vcc | L1 | L2 | S1b | S2b | S3b |
|---|---|---|---|---|---|
| Vcc1a or smaller | L | L | L | L | H |
| Vcc1a - Vcc1b | H | L | L | H | L |
| Vcc1b or larger | H | H | H | L | L |

It is assumed in Table 2 that the resistors R1 to R3 divide the value of the power-supply voltage Vcc into Vcc1a and Vcc1b (Vcc1a<Vcc1b). The values Vcc1a and Vcc1b correspond to those described about FIG. 13.

The circuit shown in FIG. 14 is an example of the configuration of the decoder DCb which generates the operation signals S1b to S3b shown in Table 2. In FIG. 14, the decoder DCb has NAND gates NAG2a to NAG2c and inverters IR5a to IR5e, where the input ends of the NAND gate NAG2a receive the output L1 of the latch circuit LH1 through the inverter IR5a and the output L2 of the latch circuit LH2 through the inverter IR5b.

The NAND gate NAG2b receives at its inputs the output L1 of the latch circuit LH1 and the output L2 of the latch circuit LH2 through the inverter IR5b. Further, the NAND gate NAG2c receives at its input ends the output L1 of the latch circuit LH1 and the output L2 of the latch circuit LH2.

The output of the NAND gate NAG2a is inputted to the inverter IR5c and the output of the inverter IR5c forms the operation signal S3b. The output of the NAND gate NAG2b is inputted to the inverter IR5d and the output of the inverter IR5d forms the operation signal S2b. The output of the NAND gate NAG2c is inputted to the inverter IR5e and the output of the inverter IR5e forms the operation signal S1b.

Figure 15:
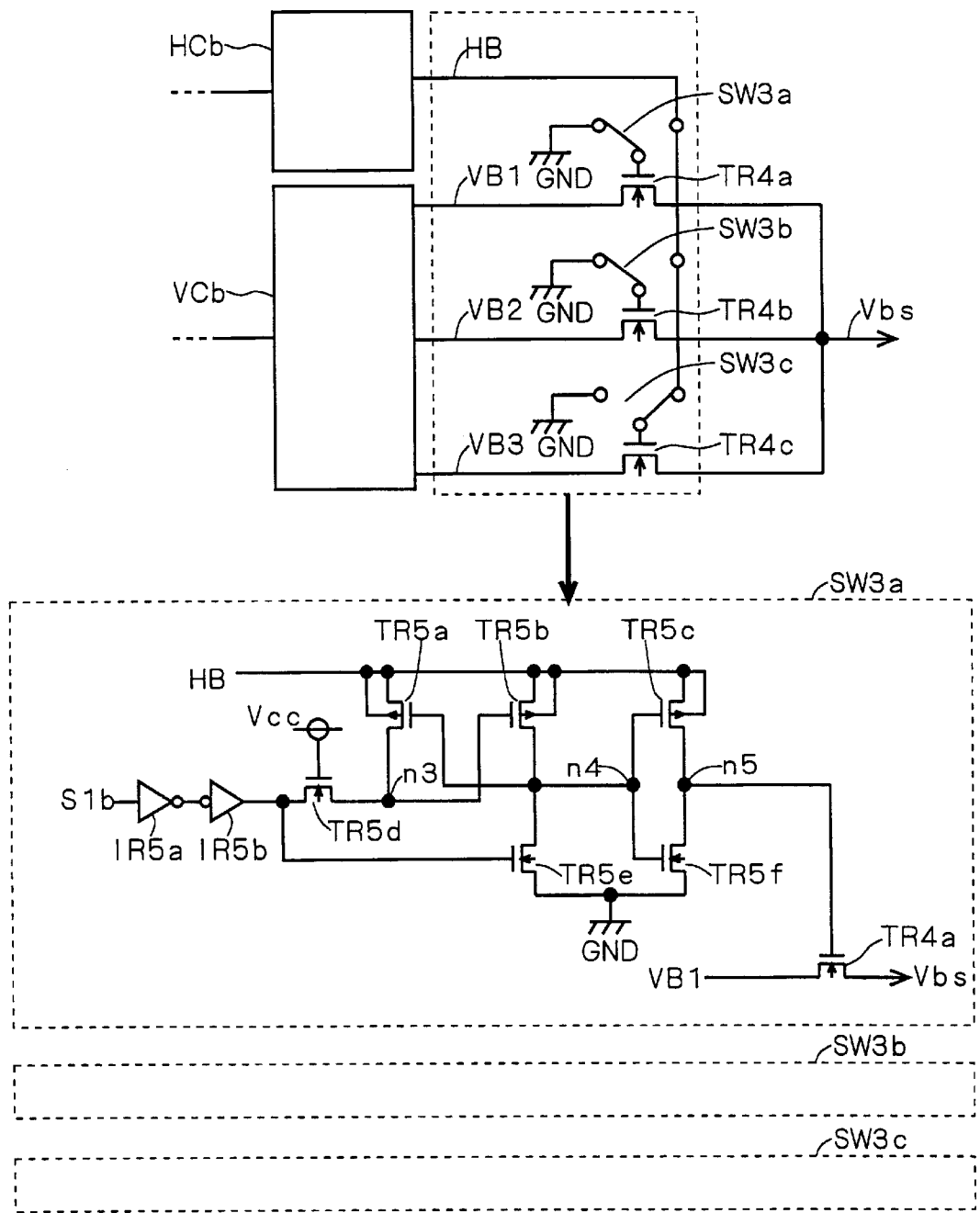

FIG. 15 shows an example of the configuration of the switch circuits SW3a to SW3c which are responsive to the operation signals S1b to S3b to change the stage from which the output is extracted. For simplicity, the diagram does not show the configuration of the switch circuits SW3b and SW3c.

The switch circuit SW3a has P-channel MOS transistors TR5a to TR5c, N-channel MOS transistors TR5d to TR5f and inverters IR5a and 5b.

First, the operation signal S1b is inputted to the inverter IR5a. The output of the inverter IR5a is inputted to the inverter IR5b. The output of the inverter IR5b is inputted to the source of the transistor TR5d and the gate of the transistor TR5e. The source of the transistor TR5e and the source of the transistor TR5f are connected to each other and the ground voltage GND is applied thereto.

The sources of the transistors TR5a to TR5c are connected in common, to which the output HB of the gate boosting circuit HCb is applied. The output HB is applied also to the bodies of the transistors TR5a to TR5c. The node n3, or the drain of the transistor TR5a, is connected to the drain of the transistor TR5d and the gate of the transistor TR5b. The node n4, or the drain of the transistor TR5b, is connected to the drain of the transistor TR5e and the gates of the transistors TR5a and TR5c and TR5f. The node n5, or the drain of the transistor TR5c, is connected to the drain of the transistor TR5f and the gate of the transistor TR4a. The gate of the transistor TR5d is supplied with the power-supply voltage Vcc.

Operation of this circuit is now described.

Figure 16:
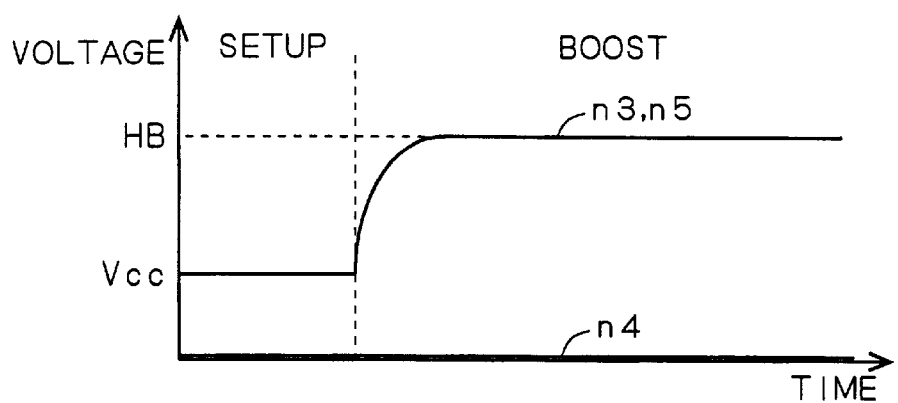
FIGS. 16 and 17 are timing charts showing operation of the word line boosting circuit of the second preferred embodiment.

First, when the operation signal S1b is high, the transistor TR5e becomes conductive and the node n4 becomes equal to the ground voltage GND. Then the transistors TR5a and TR5c become conductive. Hence the output HB of the gate boosting circuit HCb is applied to the gate of the transistor TR4a and the transistor TR4a becomes conductive. FIG. 16 shows the variations at the nodes n3 to n5 at this time.

The transistor TR5d is provided for the following reason. When the output HB of the gate boosting circuit HCb is boosted in the boost period, the value of the voltage at the node n3 becomes higher than the power-supply voltage Vcc. If the transistor TR5d is absent, a high voltage is applied to the output end of the inverter IR5b, which will cause reverse signal flow.

The presence of the transistor TR5d prevents the reverse signal flow. That is to say, when the output of the inverter IR5b goes high (i.e. the power-supply voltage Vcc), no potential difference occurs between the gate and source of the transistor TR5d, since the voltage at the gate of the transistor TR5d is at the power-supply voltage Vcc. Then the transistor TR5d do not conduct, thus preventing the reverse signal flow.

Figure 17:
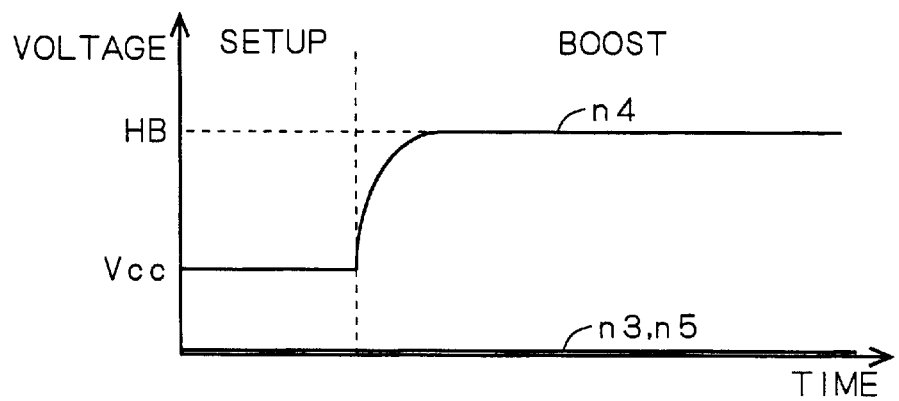

When the operation signal S1b is low, the transistor TR5d becomes conductive and the node n3 goes low (i.e. the ground voltage GND). This causes the transistor TR5b to conduct. Then the output HB of the gate boosting circuit HCb is applied to the node n4 and the transistor TR5f becomes conductive. The node n5 hence becomes equal to the ground voltage GND and the transistor TR4a does not conduct. The variations at the nodes n3 to n5 at this time are shown in FIG. 17.

The switch circuits SW3b and SW3c are constructed as above, too; the switch circuit SW3b receives the operation signal S2b in place of the operation signal S1b and the transistor TR4b turns on/off in place of the transistor TR4a. The switch circuit SW3c receives the operation signal S3b in place of the operation signal S1b and the transistor TR4c turns on/off in place of the transistor TR4a.

The switch circuits SW3a to SW3c are constructed as explained above, so that the number of the stage from which the output is extracted can be appropriately varied in accordance with the operation signals S1b to S3b.

The word line boosting circuit according to this preferred embodiment can appropriately change the stage where the output is extracted from the drain boosting circuit in accordance with the value of the power-supply voltage Vcc, so as to vary the voltage applied to the load connected to the source of the transistor TR4a–TR4c. Therefore power-supply voltages over a wide range of magnitudes can be used while generating the boosted voltage Vbs within the range between the upper limit value V1 and the lower limit value V2 of the threshold voltage distribution of the semiconductor non-volatile memory elements.

Japanese Patent Application Laid-Open No. 9-82095 (1997) describes a technique showing resemblance to the word line boosting circuit of this preferred embodiment. According to this technique, however, the number of operating boosting stages itself is increased/decreased, and its structure therefore differs from that of this invention. Further, this technique differs from the present invention also in that it does not provide boosting circuits on both gate and drain sides of the transistor TR1 as shown in this invention.

Third Preferred Embodiment

This preferred embodiment, too, realizes a word line boosting circuit which can vary the voltage applied to a load connected to the source of the transistor TR1 in accordance with the value of the power-supply voltage Vcc so that the boosted voltage Vbs falls within the range between the upper limit value V1 and the lower limit value V2 of the threshold voltage distribution of semiconductor non-volatile memory elements, whereby power-supply voltages of a variety of magnitudes can be used.

However, the word line boosting circuit of this preferred embodiment differs from the word line boosting circuit BCa of the first preferred embodiment in that the number of parallel-connected capacitors is varied not in the drain boosting circuit but in the gate boosting circuit.

The transistor TR1 remains conductive while the gate boosting circuit output HB at its gate is higher than the boosted voltage Vbs at its source by the threshold voltage Vthn of the transistor TR1. Accordingly, in this preferred embodiment, the number of parallel-connected capacitors is varied in the gate boosting circuit to vary the voltage characteristic between the power-supply voltage Vcc and the boosted voltage Vbs.

Figure 18:
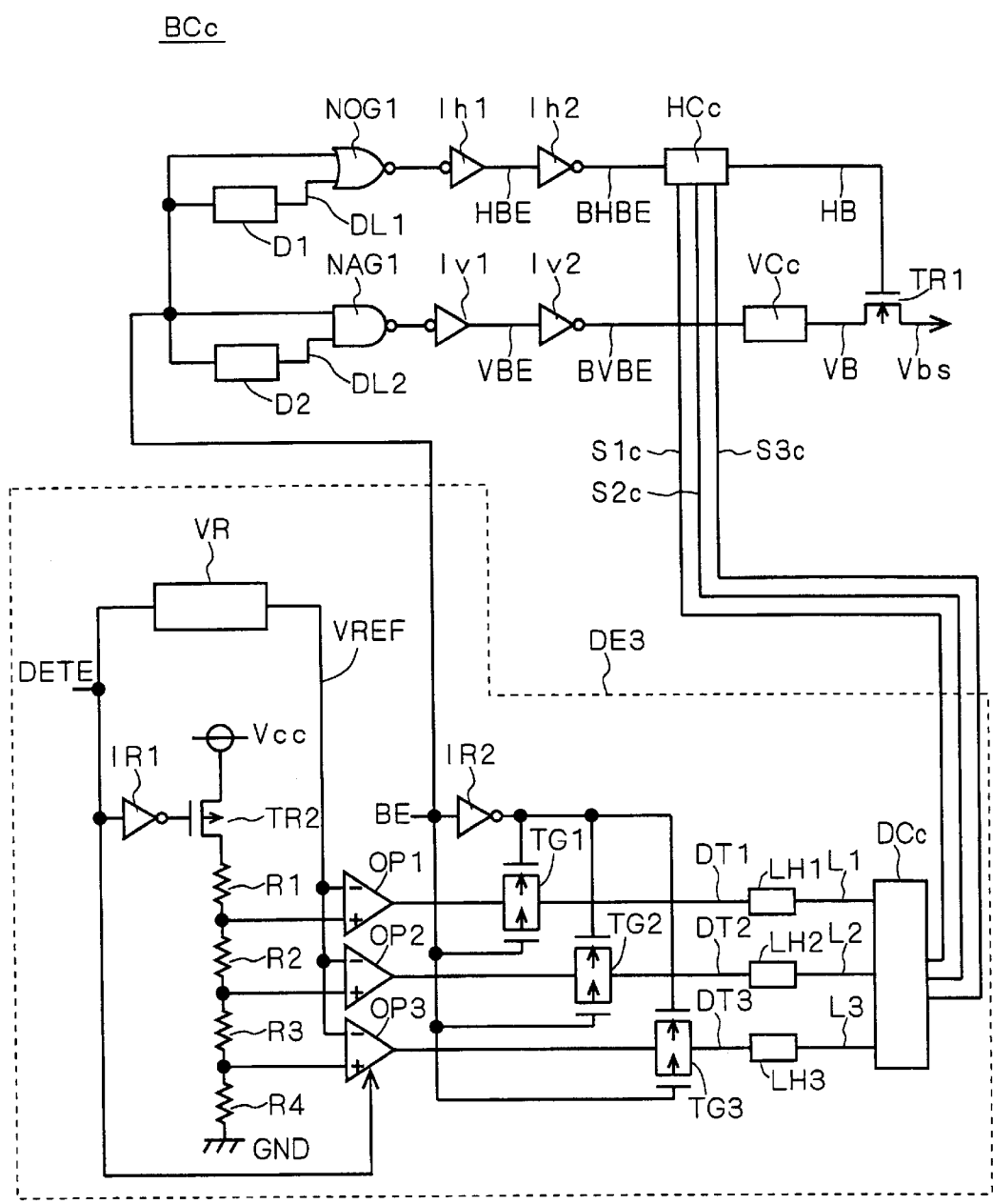
FIG. 18 is a diagram showing a boosting circuit according to a third preferred embodiment.

FIG. 18 is a diagram showing a word line boosting circuit BCc according to this preferred embodiment. In FIG. 18, elements having the same functions as those in the word line boosting circuit BCa of the first preferred embodiment are shown at the same reference characters. As shown in FIG. 18, this word line boosting circuit BCc has a gate boosting circuit HCc and a drain boosting circuit VCc in place of the gate boosting circuit HCa and the drain boosting circuit VCa in the word line boosting circuit BCa.

The gate boosting circuit HCc boosts the power-supply voltage Vcc to provide the output HB and the drain boosting circuit VCc boosts the power-supply voltage Vcc to provide the output VB.

This word line boosting circuit BCc also has a power-supply voltage detecting portion DE3 in place of the power-supply voltage detecting portion DE1. The power-supply voltage detecting portion DE3 has a decoder DCc, in place of the decoder DCa, to output operation signals S1c to S3c.

Figure 19:
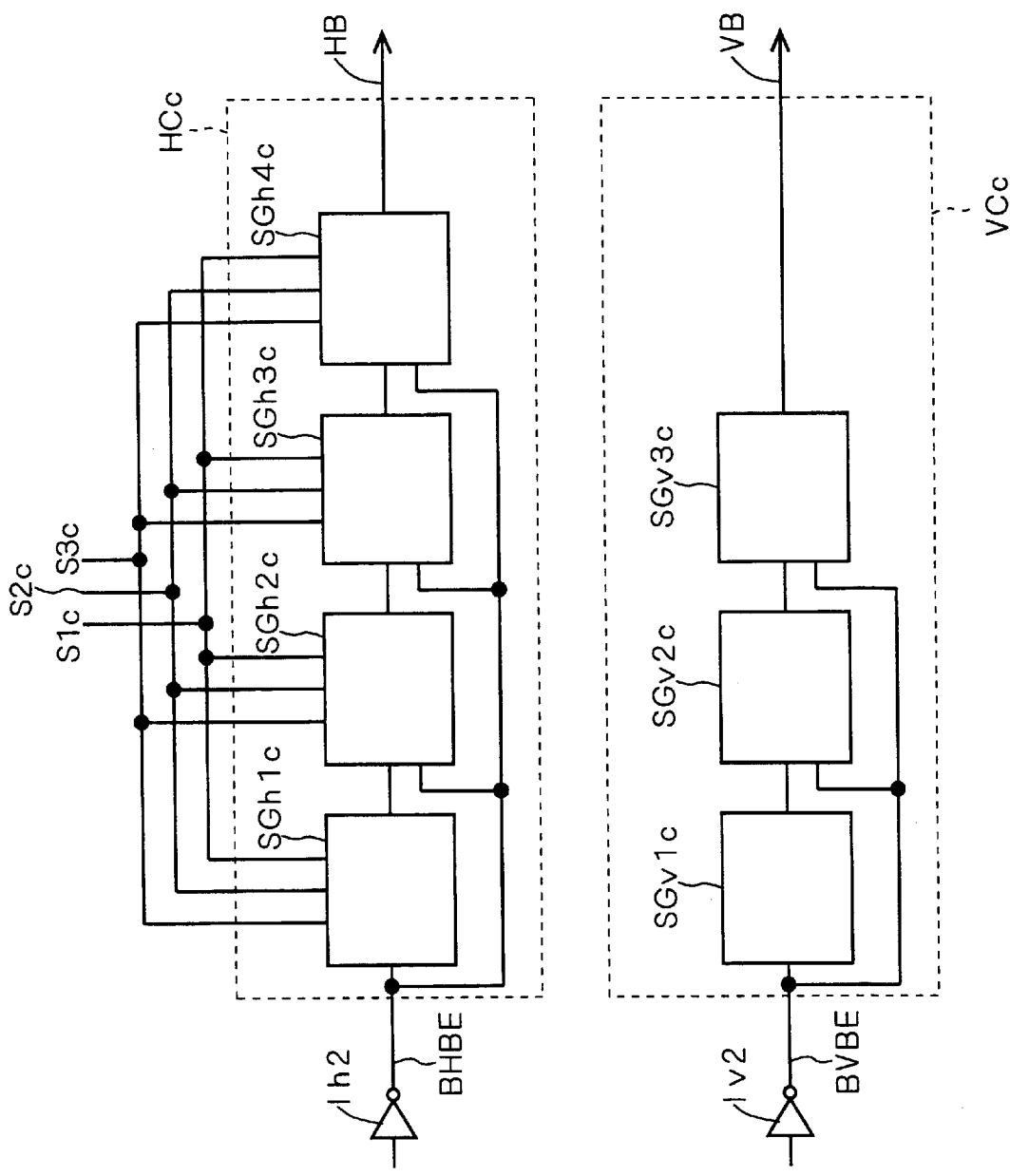
FIG. 19 is a diagram showing part of the word line boosting circuit of the third preferred embodiment.

The gate boosting circuit HCc and the drain boosting circuit VCc have structures as shown in FIG. 19. That is to say, the gate boosting circuit HCc has a plurality of boosting stages SGh1c to SGh4c connected in series, where the first boosting stage SGh1c receives the inverse gate boost enable signal BHBE from the inverter Ih2 and the final boosting stage SGh4c generates the output HB. The boosting stages SGh1c to SGh4c each receive all of the operation signals S1c to S3c. Although this example shows four boosting stages, it may include a larger or a smaller number of stages.

The drain boosting circuit VCc includes a plurality of boosting stages SGv1c to SGv3c connected in series, where the first boosting stage SGv1c receives the inverse drain boost enable signal BVBE from the inverter Iv2 and the final boosting stage SGv3c generates the output VB. Although this example shows three boosting stages, it may include a larger or a smaller number of stages. However, it is preferred that the gate boosting circuit HCc has a slightly larger number of boosting stages than the drain boosting circuit VCc, for the same reason described about the conventional drain boosting circuit VCe.

In the gate boosting circuit HCc, while the first boosting stage SGh1c receives only the inverse gate boost enable signal BHBE, the next and following boosting stages SGh2c to SGh4c receive the inverse gate boost enable signal BHBE and also an output from the preceding stage, and they each boost the output from the preceding stage using the inverse gate boost enable signal BHBE. In the drain boosting circuit VCc, similarly, while the first boosting stage SGv1c receives only the inverse drain boost enable signal BVBE, the next and following boosting stages SGv2c and SGv3c receive the inverse drain boost enable signal BVBE and also an output from the preceding stage, and they each boost the output from the preceding stage using the inverse drain boost enable signal BVBE.

The structures of the boosting stages are now described. The boosting stages in the drain boosting circuit VCc adopt the unit boosting stages SGa and SGb shown in FIGS. 33 and 34. Therefore the drain boosting circuit VCc has the same structure as the conventional drain boosting circuit VCe, which is not described again here.

The boosting stages in the gate boosting circuit HCc adopt the unit boosting stages SGc and SGd shown in FIGS. 3 and 4. Therefore the gate boosting circuit HCc has a similar structure to the drain boosting circuit VCa of the first preferred embodiment, which is not described again here.

Figure 20:
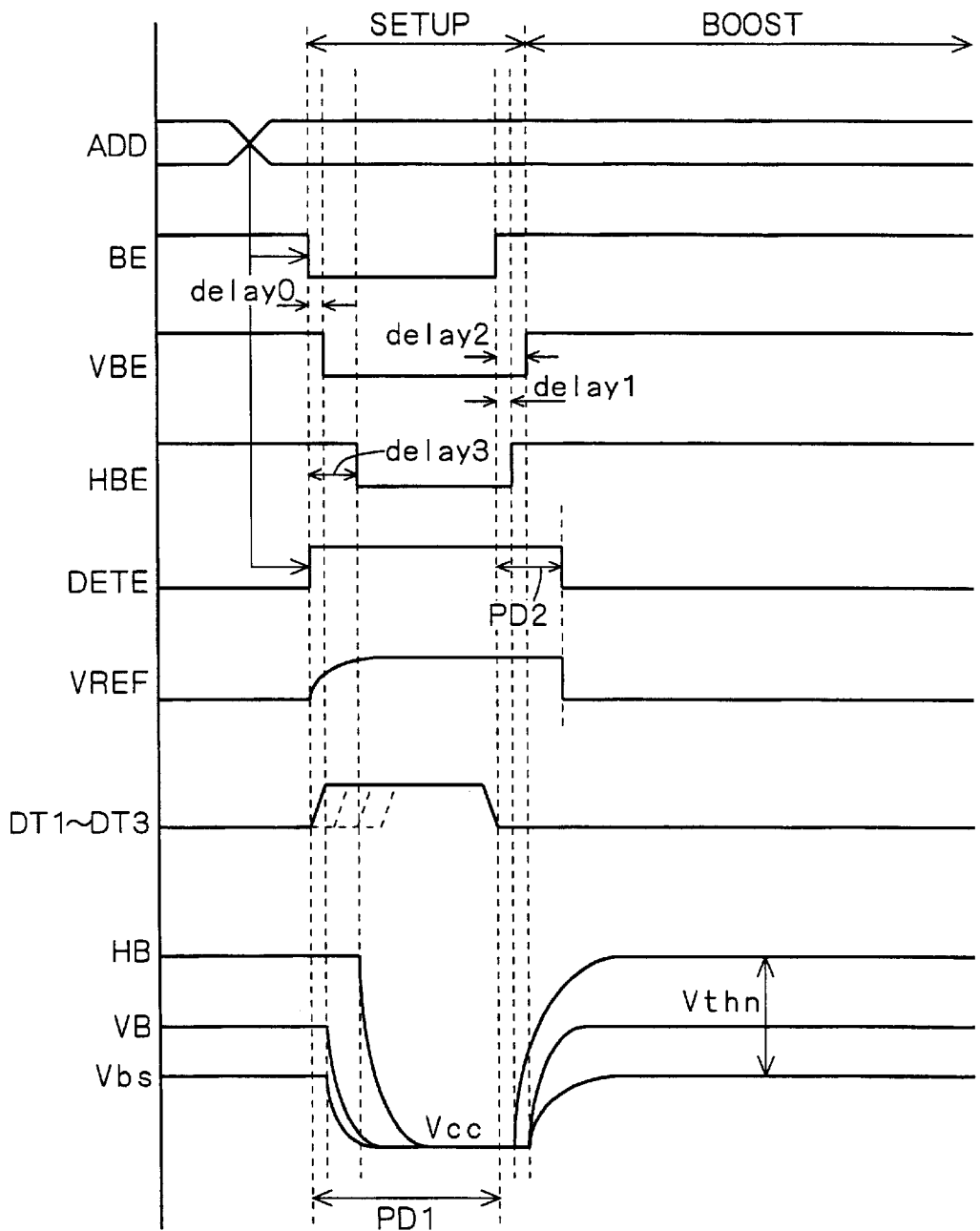
FIG. 20 is a timing chart showing operation of the word line boosting circuit of the third preferred embodiment.

Operation of this word line boosting circuit BCc is now described. FIG. 20 shows a timing chart of signal outputs from the individual parts. In the operation of the word line boosting circuit BCc, the boost enable signal BE, gate boost enable signal HBE, drain boost enable signal VBE, detect enable signal DETE, reference voltage VREF, and outputs DT1 to DT3 of the transfer gates TG1 to TG3 vary as shown in the timing chart of FIG. 5, which are not described here again.

FIG. 20 shows the variation of the boosted voltage Vbs. This boosted voltage Vbs is boosted in the boost period as a value which is lower than the value of the output HB of the gate boosting circuit HCc by the threshold voltage Vthn of the transistor TR1.

In the boosting stages in the gate boosting circuit HCc and the drain boosting circuit VCc, the signals vary in the same way as those in the drain boosting circuit VCa of the first preferred embodiment and the conventional drain boosting circuit VCe, which are not described here again.

This preferred embodiment uses the capacitance value Chboost of the capacitors C3a to C3d and the capacitors C4a to C4d adopted in the gate boosting circuit HCc, in place of Cvboost in Equation 5. The capacitance value of the load is represented as Chload, in place of Cvload in Equation 5, and the number of boosting stages is represented as Nh, in place of Nv in Equation 5. Then the boosted voltage Vbs is given as:

$$Vbs = \frac{Nh \cdot Chload + (Nh+1)Chboost}{Nh \cdot Chload + Chboost} \cdot Vcc - Vthn \qquad 7$$

Figure 21:
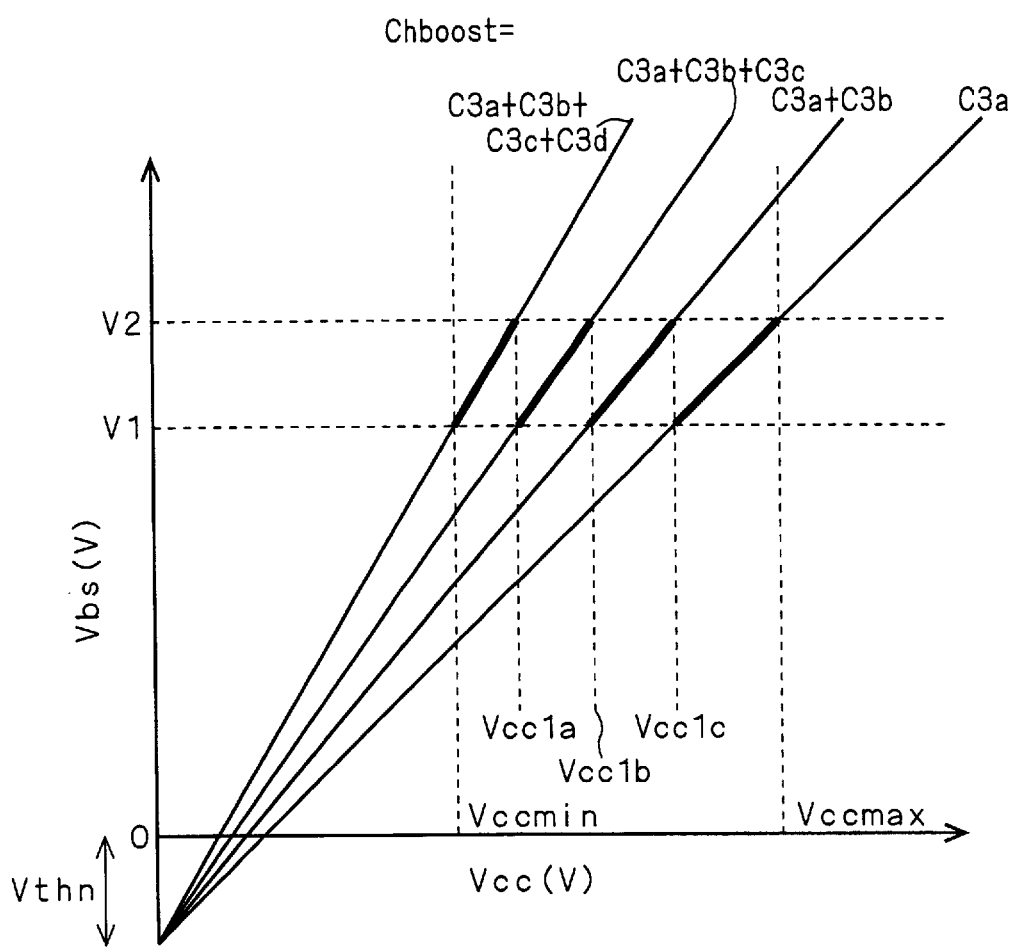
FIG. 21 is a diagram showing the relation between the boosted voltage and the power-supply voltage in the word line boosting circuit of the third preferred embodiment.

FIG. 21 shows the graph about Equation 7 of this preferred embodiment. As shown in FIG. 21, this graph is represented as if the graph shown in FIG. 6 is shifted along the axis Vbs by −Vthn. Thus, the value of Chboost increases as a larger number of capacitors are parallel-connected among the capacitors C3a to C3d, and the capacitors C4a to C4d, and then the gradient of the graph becomes steeper.

For example, as shown in FIG. 21, the configuration is set so that when only the capacitor C3a, and the capacitor C4a, are connected, the graph passes the lower limit value V2 of the threshold voltage distribution at the upper limit Vccmax of the power-supply voltage Vcc. Further, at the value Vcc1c of the power-supply voltage Vcc at which that graph passes the upper limit value V1 of the threshold voltage distribution, the graph obtained when the capacitors C3a and C3b, and the capacitors C4a and C4b, are parallel-connected passes the lower limit value V2 of the threshold voltage distribution.

Similarly, when the capacitors C3a to C3c, and the capacitors C4a to C4c, are parallel-connected, the graph passes the lower limit value V2 at the value Vcc1b of the power-supply voltage Vcc, and when all of the capacitors C3a to C3d, and capacitors C4a to C4d, are parallel-connected, the graph passes the lower limit value V2 at the value Vcc1 a of the power-supply voltage Vcc.

These graph characteristics are realized by appropriately setting the various parameters in Equation 7 and the capacitance value of the capacitors C3a to C3d and C4a to C4d.

In this way, by adopting the parts of the graphs which are within the range between the upper limit value V1 and the lower limit value V2 of the threshold voltage distribution, power-supply voltages in a wide magnitude range can be used while having the boosted voltage Vbs fall within the range between the upper limit value V1 and the lower limit value V2.

A more variety of power-supply voltages can be used by adding some more parallel-connected capacitors, in addition to the capacitors C3a to C3d and the capacitors C4a and C4d. In FIG. 21, when all of the capacitors C3a to C3d, and the capacitors C4a to C4d, are parallel-connected, the graph just passes the upper limit value V1 of the threshold voltage distribution at the lower limit Vccmin of the power-supply voltage Vcc. However, it is not essential to cause the graph to just pass the upper limit value V1 of the threshold voltage distribution. When the lower limit Vccmin is still lower, the number of parallel-connected capacitors may be increased to add an additional graph or graphs.

In order to realize the operation described above, the switch circuits SW1a to SW1c and SW2a to SW2c must appropriately operate in accordance with the value of the inverse gate boost enable signal BHBE and the value of the power-supply voltage Vcc. For this purpose, the power-supply voltage detecting portion DE3 must detect the power-supply voltage Vcc and appropriately output the operation signals S1c to S3c for controlling the switch circuits SW1a to SW1c and SW2a to SW2c.

The operation signals S1a to S3a shown in the first preferred embodiment can be used as the operation signals S1c and S3c. Accordingly the decoder DCa can be used as the decoder DCc in the power-supply voltage detecting circuit DE3. That is to say, the configuration and operation of the power-supply voltage detecting circuit DE3 are the same as those of the power-supply voltage detecting circuit DE1. Therefore they are not described again here.

The word line boosting circuit according to this preferred embodiment can vary the number of parallel-connected capacitors among the capacitors C3a to C3d and capacitors C4a to C4d in the gate boosting circuit in accordance with the value of the power-supply voltage Vcc, so as to vary the voltage applied to the load connected to the source of the transistor TR1. Therefore power-supply voltages of various magnitudes can be used while generating the boosted voltage Vbs within the range between the upper limit value V1 and the lower limit value V2 of the threshold voltage distribution of the semiconductor non-volatile memory elements.

Fourth Preferred Embodiment

This preferred embodiment, too, realizes a word line boosting circuit which can vary the voltage acting on a load connected to the source of the transistor TR1 in accordance with the value of the power-supply voltage Vcc so that the boosted voltage Vbs falls within the range between the upper limit value V1 and the lower limit value V2 of the threshold voltage distribution of semiconductor non-volatile memory elements, whereby power-supply voltages of a variety of magnitudes can be used.

However, unlike the word line boosting circuit BCb of the second preferred embodiment, the word line boosting circuit of this preferred embodiment varies the voltage applied to the load by changing the point where the boosted voltage is extracted not from the drain boosting circuit but from the gate boosting circuit. The number of capacitors in each boosting stage is unchanged.

Figure 22:
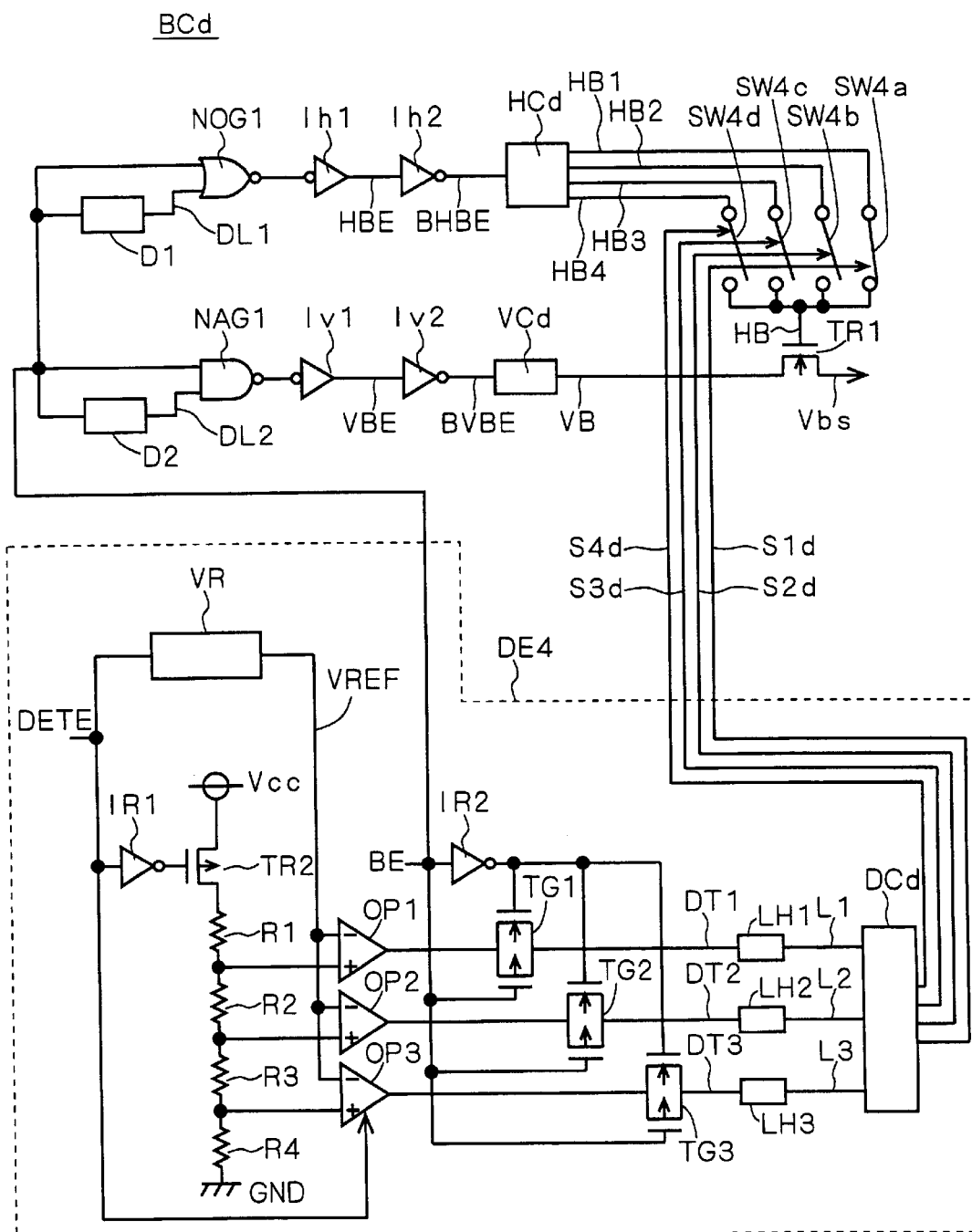
FIG. 22 is a diagram showing a word line boosting circuit according to a fourth preferred embodiment.

The transistor TR1 remains conductive while the gate boosting circuit output at its gate is higher than the boosted voltage Vbs at its source by the threshold voltage Vthn of the transistor TR1. Accordingly, in this preferred embodiment, the stage where the output is extracted from the gate boosting circuit is changed to vary the voltage characteristic between the power-supply voltage Vcc and the boosted voltage Vbs. FIG. 22 is a diagram showing a word line boosting circuit BCd according to this preferred embodiment. In FIG. 22, elements having the same functions as those in the word line boosting circuit BCa of the first preferred embodiment are shown at the same reference characters. As shown in FIG. 22, this word line boosting circuit BCd has a gate boosting circuit HCd and a drain boosting circuit VCd in place of the gate boosting circuit HCa and the drain boosting circuit VCa in the word line boosting circuit BCa.

The gate boosting circuit HCd boosts the power-supply voltage Vcc to provide outputs HB1 to HB4 and the drain boosting circuit VCd boosts the power-supply voltage Vcc to provide the output VB.

In this word line boosting circuit BCd, one of the outputs HB1 to HB4 of the gate boosting circuit HCd is applied to the gate of the transistor TR1 through switch circuits SW4a to SW4d. The boosted voltage Vbs is outputted at the source of the transistor TR1.

This word line boosting circuit BCd also has a power-supply voltage detecting portion DE4 in place of the power-supply voltage detecting portion DE1. The power-supply voltage detecting portion DE4 has a decoder DCd, in place of the decoder DCa, to output operation signals S1d to S4d.

Figure 23:
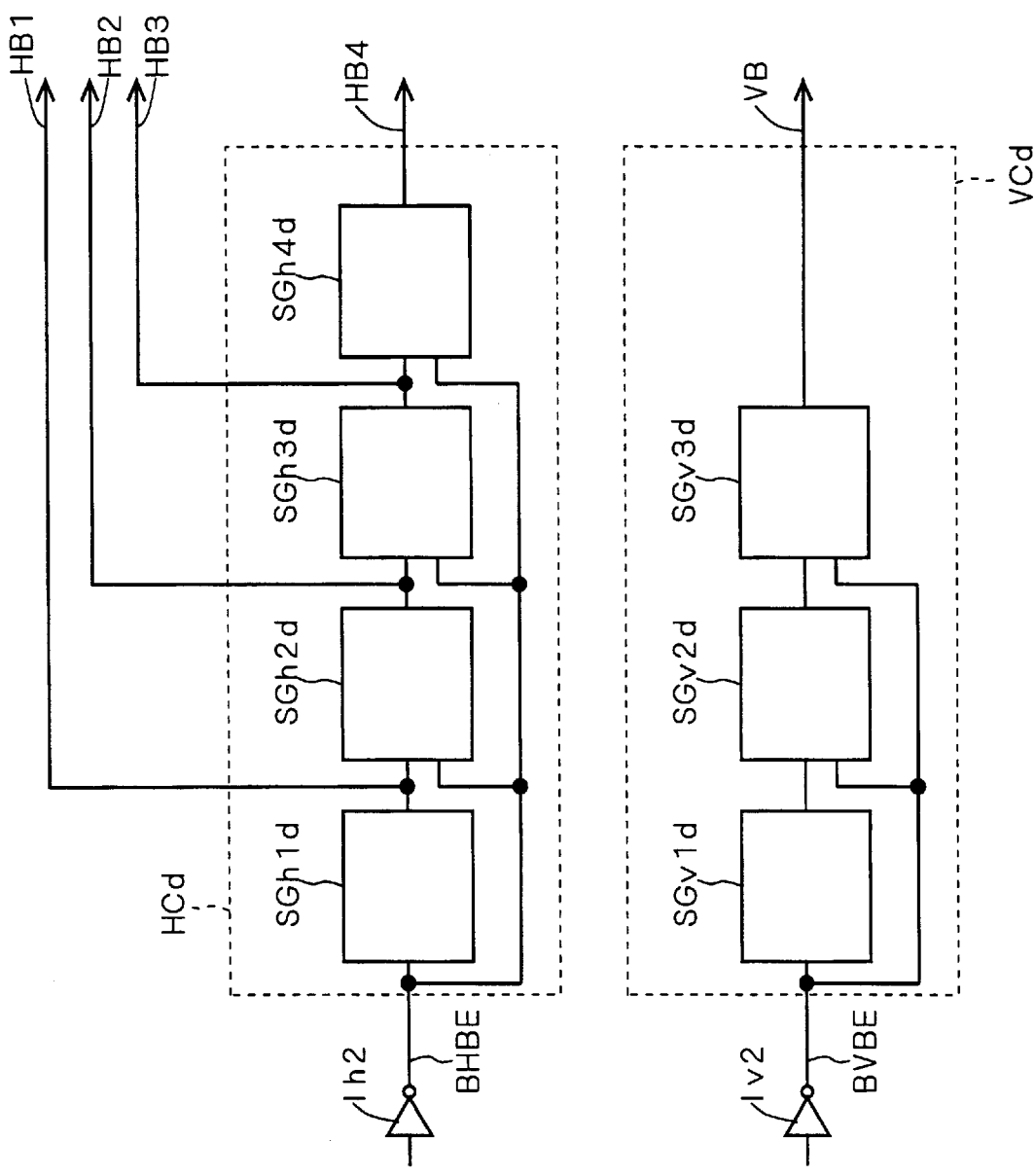
FIG. 23 is a diagram showing part of the word line boosting circuit of the fourth preferred embodiment.

The gate boosting circuit HCd and the drain boosting circuit VCd have structures as shown in FIG. 23. That is to say, the gate boosting circuit HCd has a plurality of boosting stages SGh1d to SGh4d connected in series, where the first boosting stage SGh1d receives the inverse gate boost enable signal BHBE from the inverter Ih2 and outputs the output HB1. The next boosting stage SGh2d generates the output HB2 and the third boosting stage SGh3d generates the output HB3. The final boosting stage SGh4d generates the output HB4. Although this example shows four boosting stages, it may include a larger or a smaller number of stages.

The drain boosting circuit VCd includes a plurality of boosting stages SGv1d to SGv3d connected in series, where the first boosting stage SGv1d receives the inverse drain boost enable signal BVBE from the inverter Iv2. The final boosting stage SGv3d generates the output VB.

Although this example shows three boosting stages, it may include a larger or a smaller number of stages. However, it is preferred that the gate boosting circuit HCd should have a slightly larger number of boosting stages than the drain boosting circuit VCd, for the same reason described about the conventional drain boosting circuit VCe.

In the gate boosting circuit HCd, while the first boosting stage SGh1d receives only the inverse gate boost enable signal BHBE, the next and following boosting stages SGh2d to SGh4d receive the inverse gate boost enable signal BHBE and also an output from the preceding stage, and they each boost the output from the preceding stage using the inverse gate boost enable signal BHBE. Similarly, in the drain boosting circuit VCd, while the first boosting stage SGv1d receives only the inverse drain boost enable signal BVBE, the next and following boosting stages SGv2d and SGv3d receive the inverse drain boost enable signal BVBE and also an output from the preceding stage, and they each boost the output from the preceding stage using the inverse drain boost enable signal BVBE.

The structures of the boosting stages are now described. The boosting stages in the gate boosting circuit HCd adopt the unit boosting stages SGa and SGb shown in FIGS. 33 and 34. Therefore the gate boosting circuit HCd has the same structure as the conventional gate boosting circuit HCe, which is not described again here.

The boosting stages in the drain boosting circuit VCd also adopt the unit boosting stages SGa and SGb shown in FIGS. 33 and 34. Therefore the drain boosting circuit VCd also has the same structure as the conventional drain boosting circuit VCe, which is not described again here.

Operation of this word line boosting circuit BCd is now described. In the operation of the word line boosting circuit BCd, the boost enable signal BE, gate boost enable signal HBE, drain boost enable signal VBE, detect enable signal DETE, reference voltage VREF, and outputs DT1 to DT3 of the transfer gates TG1 to TG3 vary as shown in the timing chart of FIG. 20, which are not described here again.

In the boosting stages in the gate boosting circuit HCd and the drain boosting circuit VCd, the signals vary in the same way as those in the conventional gate boosting circuit HCe and drain boosting circuit VCe, which are not described here again.

In this word line boosting circuit BCd, the output HB1 is extracted from the first boosting stage SGh1d in the gate boosting circuit HCd, the output HB2 from the next boosting stage SGh2d, the output HB3 from the third boosting stage SGh3d, and the output HB4 from the final boosting stage SGh4d. In the boost period, the output HB1 is 2Vcc, the output HB2 is 3Vcc, the output HB3 is 4Vcc, and the output HB4 is 5Vcc. One of the switch circuits SW4a to SW4d is made to conduct to make the transistor TR1 conduct, so as to generate the boosted voltage Vbs.

First, when the switch circuit SW4d conducts, the voltage applied to the load connected to the source of the transistor TR1 is boosted in the same way as in the word line boosting circuit BCe. The transistor TR1 remains conductive while the output HB4 of the gate boosting circuit HCd at the gate of the transistor TR1 has a value higher than the value of the boosted voltage Vbs by the threshold voltage Vthn of the transistor TR1.

When the switch circuit SW4c conducts, the voltage applied to the load connected to the source of the transistor TR1 is boosted to a smaller value than when the switch circuit SW4d conducts, since the value of the output HB3 is smaller than the output HB4. When the switch circuit SW4b conducts, the voltage applied to the load connected to the source of the transistor TR1 is boosted to a smaller value than when the switch circuit SW4c conducts, since the value of the output HB2 is smaller than the output HB3. Further, when the switch circuit SW4a conducts, the voltage applied to the load connected to the source of the transistor TR1 is boosted to a smaller value than when the switch circuit SW4b conducts, since the value of the output HB1 is smaller than the output HB2.

In this preferred embodiment, capacitance value Chboost of the capacitors C1 and C2 adopted in the gate boosting circuit HCc is used in place of Cvboost in Equation 5. The capacitance value of the load is represented as Chload in place of Cvload in Equation 5, and the number of boosting stages is represented as Nh in place of Nv in Equation 5.

Further, in this preferred embodiment, the number of boosting stages, Nh, varies depending on from which boosting stage the output is extracted. Accordingly, the equation below holds where the number (ordinal number) Nha of the stage from which the output is extracted is used instead of the number of stages, Nh:

$$Vbs = \frac{Nha \cdot Chload + (Nha + 1)Chboost}{Nha \cdot Chload + Chboost} \cdot Vcc - Vthn \qquad 8$$

Figure 24:
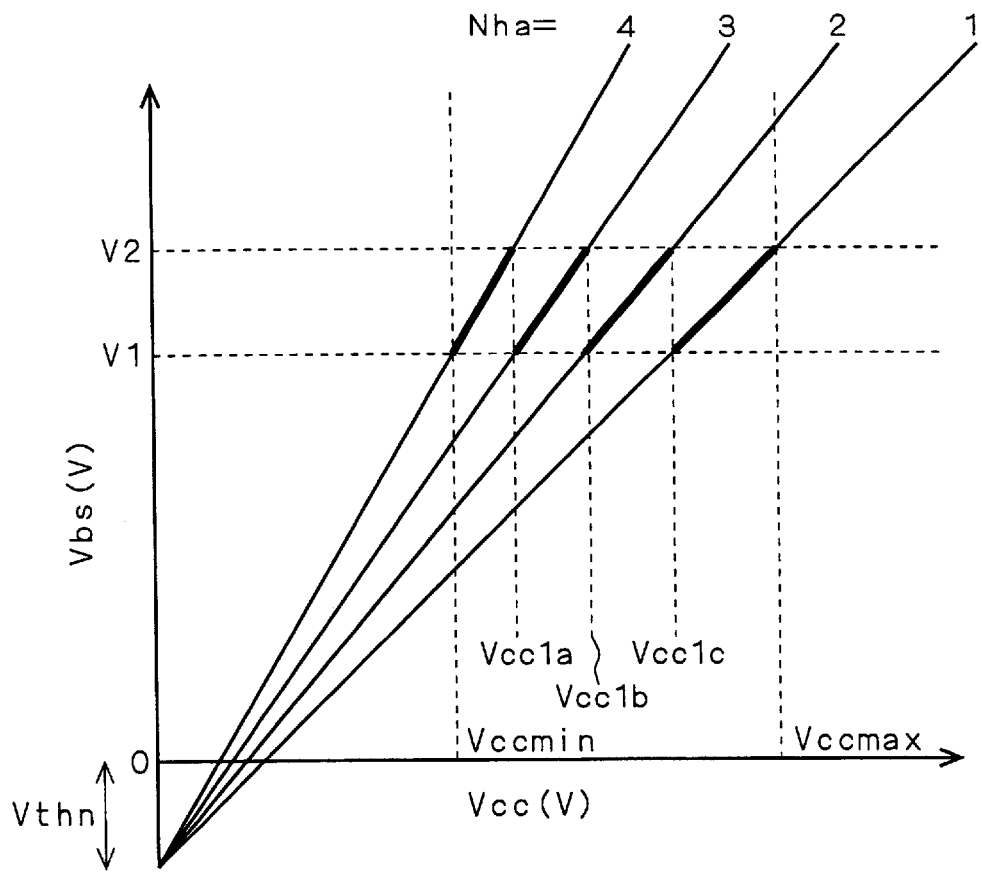
FIG. 24 is a diagram showing the relation between the boosted voltage and the power-supply voltage in the word line boosting circuit of the fourth preferred embodiment.

Thus, also in the graph of FIG. 37, the gradient varies depending on the number Nha of the stage from which the output is extracted. FIG. 24 is a graph about Equation 8 of this preferred embodiment. The graph becomes steeper as the value of Nha becomes larger, i.e. as the output is extracted from a latter stage. As shown in FIG. 24, the graph has an intercept corresponding to −Vthn on the axis Vbs.

For example, as shown in FIG. 24, the configuration is set so that, when the value of Nha is one, i.e. when the output is extracted from the first stage, the graph passes the lower limit value V2 of the threshold voltage distribution at the upper limit Vccmax of the power-supply voltage Vcc. Further, at the value Vcc1c of the power-supply voltage Vcc at which that graph passes the upper limit value V1 of the threshold voltage distribution, the graph obtained when Nha is two, i.e. when the output is extracted from the second stage, passes the lower limit value V2 of the threshold voltage distribution. Moreover, at the value Vcc1b of the power-supply voltage Vcc at which that graph passes the upper limit value V1 of the threshold voltage distribution, the graph obtained when Nha is three, i.e. when the output is extracted from the third stage, passes the lower limit value V2 of the threshold voltage distribution.

Similarly, when Nha is four, i.e. when the output is extracted from the fourth stage, the graph passes the lower limit value V2 at the value Vcc1a of the power-supply voltage Vcc.

These graph characteristics are realized by appropriately setting the various parameters in Equation 8.

In this way, by adopting the parts of the graphs which are within the range between the upper limit value V1 and the lower limit value V2 of the threshold voltage distribution, power-supply voltages of various magnitudes can be used while generating the boosted voltage Vbs within the range between the upper limit value V1 and the lower limit value V2.

A wider range of power-supply voltages can be used by providing a more variety of choice of Nha, i.e. by increasing the number of stages from which the output can be extracted. In FIG. 24, when the value of Nha is four, i.e. when the output is extracted from the fourth stage, the graph just passes the upper limit value V1 of the threshold voltage distribution at the lower limit Vccmin of the power-supply voltage Vcc. However, it is not essential to cause the graph to just pass the upper limit value V1 of the threshold voltage distribution. When the lower limit Vccmin is still lower, the number of stages may be increased to add an additional graph or graphs.

In order to realize the operation described above, the switch circuits SW4a to SW4d must appropriately operate in accordance with the value of the power-supply voltage Vcc. For this purpose, the power-supply voltage detecting portion DE4 must detect the power-supply voltage Vcc and appropriately output the operation signals S1d to S4d for controlling the switch circuits SW4a to SW4d.

Now, first, operation of the power-supply voltage detecting portion DE4 is described. The power-supply voltage detecting portion DE4 is the same as the power-supply voltage detecting portion DE1 except that it includes the decoder DCd in place of the decoder DCa. Therefore it is described only briefly here.

First, when the detect enable signal DETE goes active (e.g. high-active) in response to the ATD signal, then the power-supply voltage Vcc is divided by the resistors R1 to R4 and appears at the second ends of the resistors R1 to R3 as values decreasing in steps. The comparators OP1 and OP3 respectively compare the voltages appearing at the second ends of the resistors R1 to R3 with the reference voltage VREF. Their outputs go active (e.g. high-active) when the voltages appearing at the second ends of the resistors R1 to R3 are larger than the reference voltage VREF.

Since the boost enable signal BE becomes inactive (e.g. high-active) in response to the ATD signal, the transfer gates TG1 to TG3 all transfer the outputs from the comparators OP1 to OP3 as the outputs DT1 to DT3 to the latch circuits LH1 to LH3.

The information of the outputs DT1 to DT3 is held in the latch circuits LH1 to LH3 and their outputs L1 to L3 are all inputted to the decoder DCd. The decoder DCd generates the operation signals S1d to S4d in accordance with the active-inactive combination of the outputs L1 to L3. The combinations are shown in Table 3 below.

TABLE 3

| Vcc | L1 | L2 | L3 | S1d | S2d | S3d | S4d |
|---|---|---|---|---|---|---|---|
| Vcc1a or smaller | L | L | L | L | L | L | H |
| Vcc1a–Vcc1b | H | L | L | L | L | H | L |
| Vcc1b–Vcc1c | H | H | L | L | H | L | L |
| Vcc1c or larger | H | H | H | H | L | L | L |

It is assumed in Table 3 that the resistors R1 to R4 divide the value of the power-supply voltage Vcc into Vcc1a, Vcc1b and Vcc1c (Vcc1a<Vcc1b<Vcc1c). The values Vcc1a to Vcc1c correspond to those described about FIG. 24.

Figure 25:
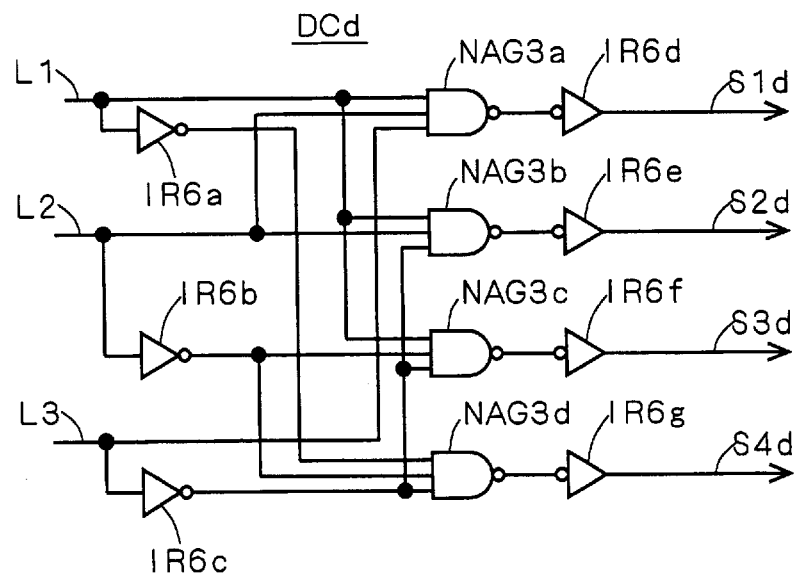
FIGS. 25 and 26 are diagrams showing parts of the word line boosting circuit of the fourth preferred embodiment.

The circuit shown in FIG. 25 is an example of the configuration of the decoder DCd which generates the operation signals S1d to S4d shown in Table 3. In FIG. 25, the decoder DCd has NAND gates NAG3a to NAG3d and inverters IR6a to IR6g, where the input ends of the NAND gate NAG3a receive the output L1 of the latch circuit LH1, the output L2 of the latch circuit LH2, and the output L3 of the latch circuit LH3.

The NAND gate NAG3b receives, at its inputs, the output L1 of the latch circuit LH1 and the output L2 of the latch circuit LH2, and the output L3 of the latch circuit LH3 through the inverter IR6c. Further, the NAND gate NAG3c receives, at its input ends, the output L1 of the latch circuit LH1, the output L2 of the latch circuit LH2 through the inverter IR6b, and the output L3 of the latch circuit LH3 through the inverter IR6c. The NAND gate NAG3d receives, at its input ends, the output L1 of the latch circuit LH1 through the inverter IR6a, the output L2 of the latch circuit LH2 through the inverter IR6b, and the output L3 of the latch circuit LH3 through the inverter IR6c.

The output of the NAND gate NAG3a is inputted to the inverter IR6d and the output of the inverter IR6d forms the operation signal S1d. The output of the NAND gate NAG3b is inputted to the inverter IR6e and the output of the inverter IR6e forms the operation signal S2d. The output of the NAND gate NAG3c is inputted to the inverter IR6f and the output of the inverter IR6f forms the operation signal S3d. The output of the NAND gate NAG3d is inputted to the inverter IR6g and the output of the inverter IR6g forms the operation signal S4d.

Figure 26:
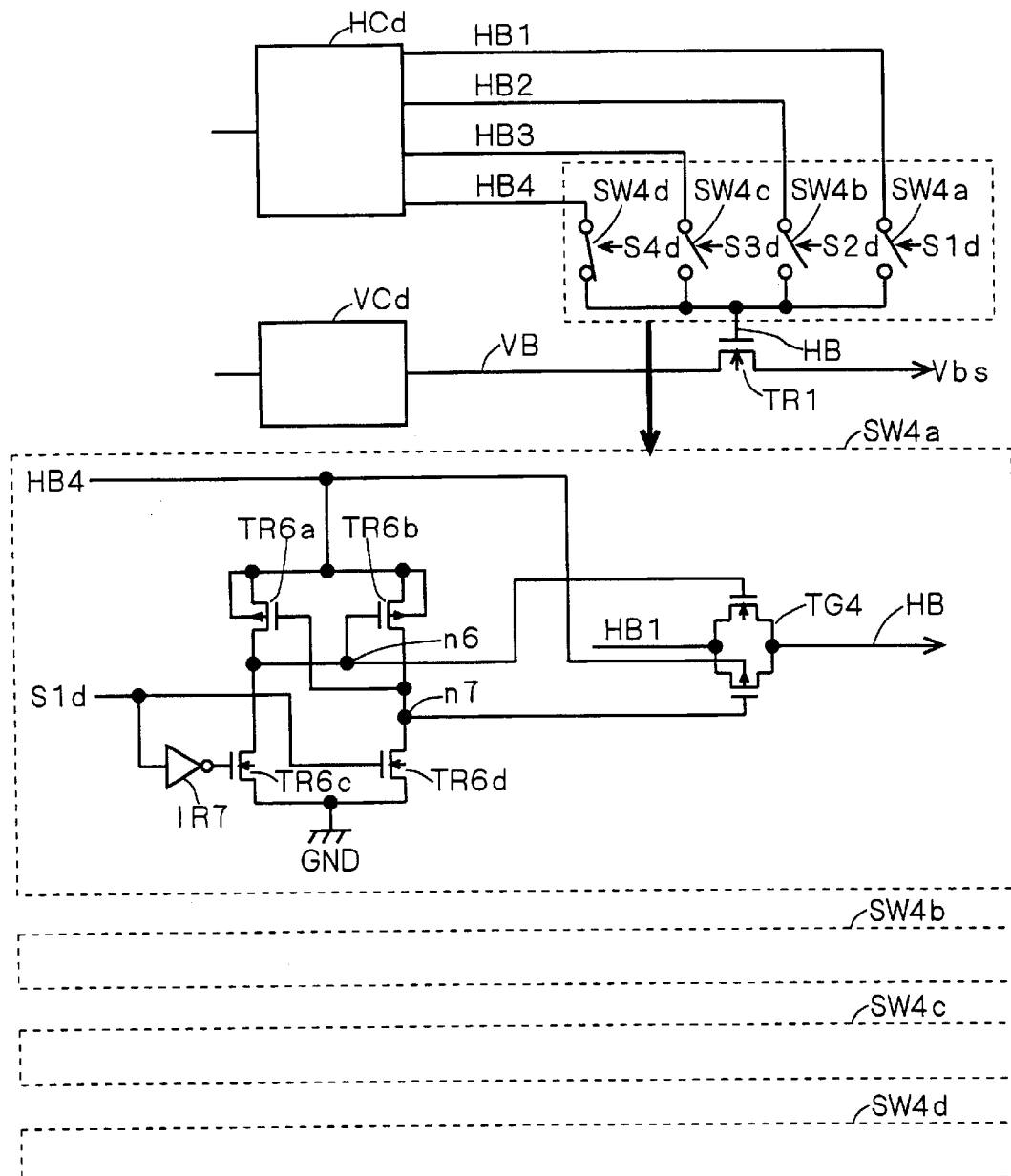
Figure 29:
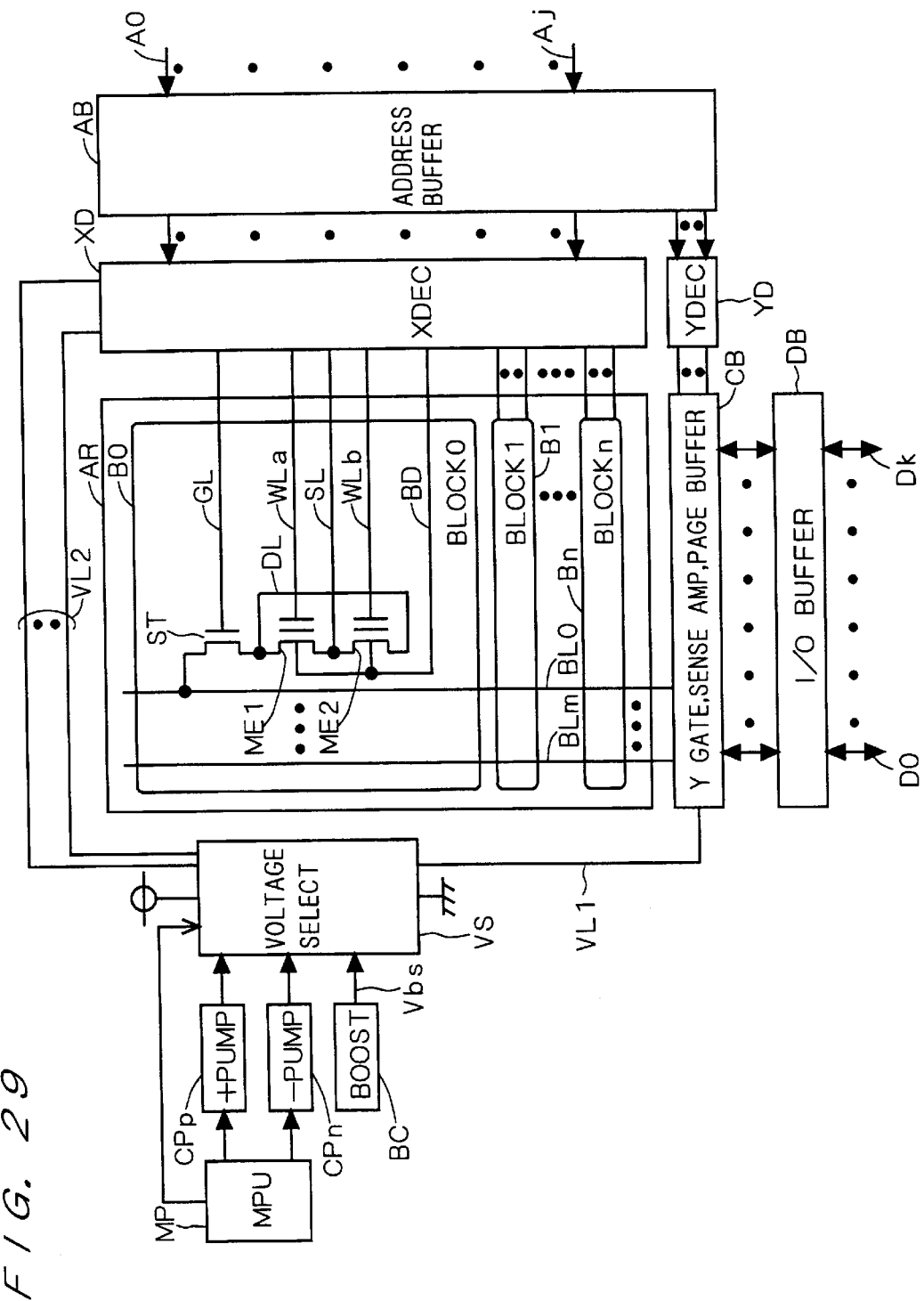
FIG. 29 is a diagram showing a semiconductor storage device having semiconductor non-volatile memory elements.
Figure 30:
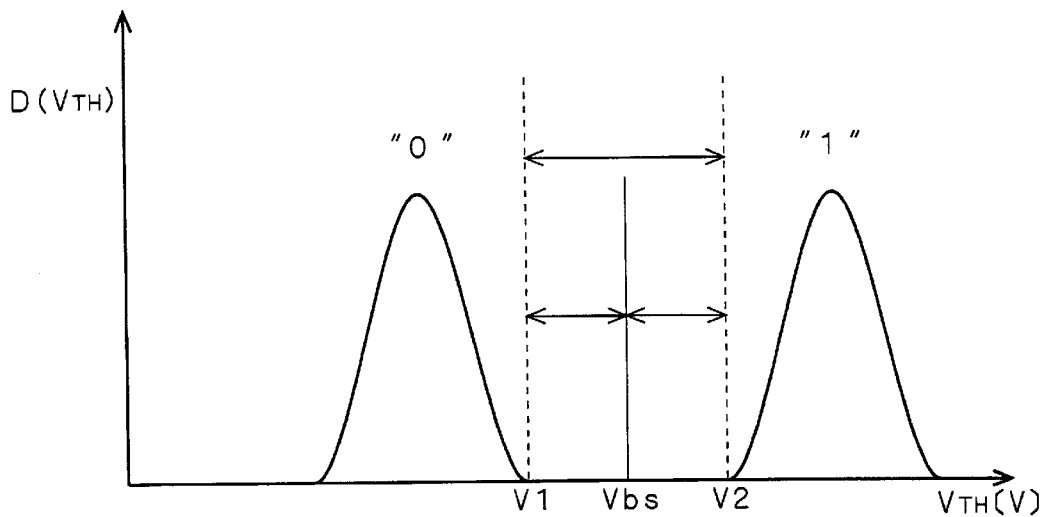
FIG. 30 is a diagram showing the relation between the threshold voltage of flash memory elements and the distribution.
Figure 31:
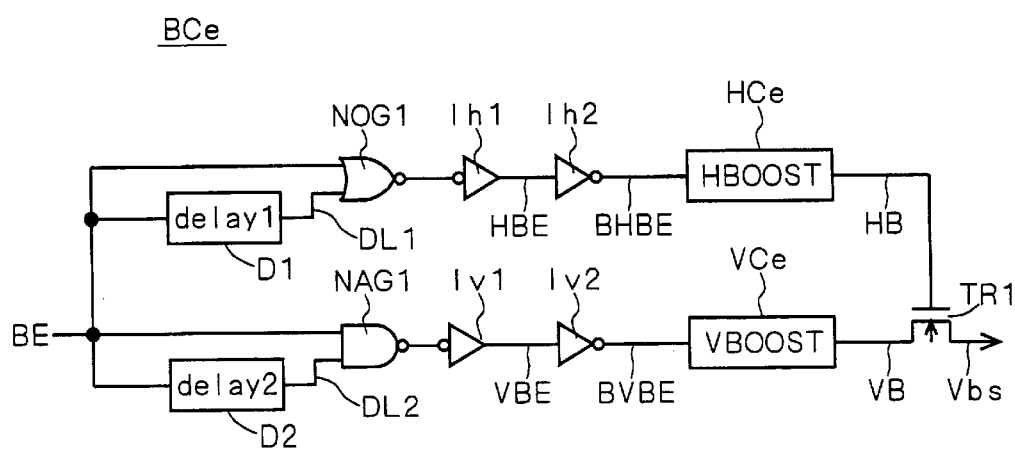
FIG. 31 is a diagram showing a conventional word line boosting circuit.
Figure 32:
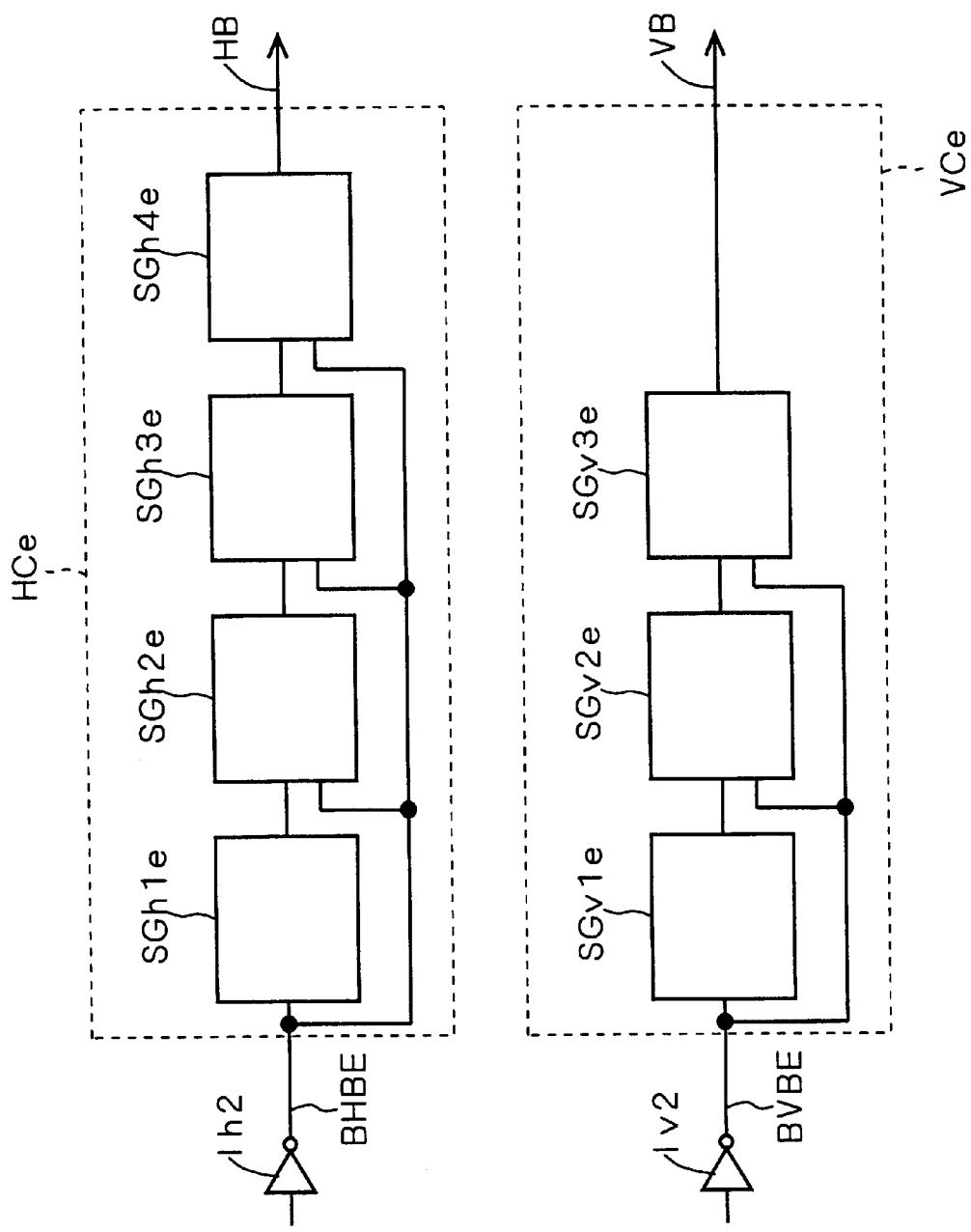
FIGS. 32 to 34 are diagrams showing parts of the conventional word line boosting circuit.

FIG. 26 shows an example of the configuration of the switch circuits SW4a to SW4d which are respectively responsive to the operation signals S1d to S4d to change the stage from which the output is extracted. For simplicity, the diagram does not show the configuration of the switch circuits SW4b to SW4d.

The switch circuit SW4a has P-channel MOS transistors TR6a and TR6b, N-channel MOS transistors TR6c and TR6d, an inverter IR7 and a transfer gate TG4.

First, the operation signal S1d is inputted to the inverter IR7 and the gate of the transistor TR6d. The output of the inverter IR7 is inputted to the gate of the transistor TR6c. The source of the transistor TR6c and the source of the transistor TR6d are connected to each other, to which the ground voltage GND is applied.

The sources of the transistors TR6a and TR6b are connected in common, to which the output HB4 of the gate boosting circuit HCd is applied. The output HB4 is applied also to the bodies of the transistors TR6a and TR6b and the P-channel MOS transistor of the transfer gate TG4.

The node n6, or the drain of the transistor TR6a, is connected to the drain of the transistor TR6c, the gate of the transistor TR6b, and the gate of the N-channel MOS transistor in the transfer gate TG4. The node n7, or the drain of the transistor TR6b, is connected to the drain of the transistor TR6d, the gate of the transistor TR6a, and the gate of the P-channel MOS transistor in the transfer gate TG4. The transfer gate TG4 receives at its input end the output HB1 of the gate boosting circuit HCd and outputs from its output end the output HB to the gate of the transistor TR1.

Operation of this circuit is now described.

First, when the operation signal S1d is high, the transistor TR6d becomes conductive and the node n7 becomes equal to the ground voltage GND. Then the transistor TR6a becomes conductive. Hence the node n6 attains the output HB4. The transfer gate TG4 operates and applies the output HB1 to the gate of the transistor TR1 as the output HB. FIG. 27 shows the variations at the nodes n6 and n7.

When the operation signal S1d is low, the transistor TR6c conducts through the inverter IR7 and the node n6 goes to the ground voltage GND. This makes the transistor TR6b conductive. The gate of the N-channel MOS transistor in the transfer gate TG4 does not become conductive.

When the transistor TR6b conducts, the output HB4 of the gate boosting circuit HCd is applied to the node n7 and the gate of the P-channel MOS transistor in the transfer gate TG4 does not conduct. Hence the transfer gate TG4 does not operate. The variations at the nodes n6 and n7 are shown in FIG. 28.

The output HB4, which is the highest voltage among the outputs of the gate boosting circuit HCd, is applied to the body of the P-channel MOS transistor in the transfer gate TG4 for the reason below. When a voltage higher than the source voltage is applied to the body of the P-channel MOS transistor, the threshold between the source and gate of the P-channel MOS transistor in the transfer gate TG4 becomes further larger in the negative direction due to the threshold bias effect of the body voltage. Therefore this transistor becomes further unlikely to conduct. This ensures non-conduction of the transfer gate TG4.

The switch circuits SW4a to SW4d, too, are constructed as explained above, so that the stage from which the output is extracted can be appropriately changed in accordance with the operation signals S1d to S4d.

The word line boosting circuit according to this preferred embodiment can appropriately change the stage where the output is extracted from the gate boosting circuit in accordance with the value of the power-supply voltage Vcc, so as to vary the voltage applied to the load connected to the source of the transistor TR1. Therefore power-supply voltages in a wide magnitude range can be used while generating the boosted voltage Vbs within the range between the upper limit value V1 and the lower limit value V2 of the threshold voltage distribution of the semiconductor non-volatile memory elements.

While the invention has been described in detail, the foregoing description is in all aspects illustrative and not restrictive. It is understood that numerous other modifications and variations can be devised without departing from the scope of the invention.

What is claimed is:

1. A boosting circuit comprising:
    a detecting portion for detecting the value of a power-supply voltage; and
    a first boosting stage comprising a plurality of capacitors, for boosting said power-supply voltage using at least one of said plurality of capacitors,
        wherein said detecting portion determines, in accordance with the detected value of said power-supply voltage, whether to use one of said plurality of capacitors alone in said first boosting stage or to use a parallel connection of some or all of said plurality of capacitors.

2. The boosting circuit according to claim 1, further comprising,
    a transistor having first and second current electrodes and a control electrode, and
    a second boosting stage comprising a capacitor, for boosting said power-supply voltage by using said capacitor, wherein an output of said first boosting stage is applied to said first current electrode of said transistor, and
        wherein an output of said second boosting stage is applied to said control electrode of said transistor.

3. The boosting circuit according to claim 2,
    wherein said first and second boosting stages receive a first signal,
    and wherein when said first signal takes a first logical value, said first and second boosting stages apply a ground potential to first ends of said plurality of capacitors or to a first end of said capacitor and apply said power-supply voltage to second ends of said plurality of capacitors or to a second end of said capacitor, so as to charge said plurality of capacitors or said capacitor, and
    when said first signal takes a second logical value which differs from said first logical value, said first and second boosting stages boost the potential at said first ends of said plurality of capacitors or at said first end of said capacitor from said ground potential while keeping the potential at said second ends of said plurality of capacitors or at said second end of said capacitor in a floating state.

4. The boosting circuit according to claim 1, further comprising
    a transistor having first and second current electrodes and a control electrode, and
    a second boosting stage comprising a capacitor, for boosting said power-supply voltage by using said capacitor, wherein an output of said first boosting stage is applied to said control electrode of said transistor, and
        wherein an output of said second boosting stage is applied to said first current electrode of said transistor.

5. The boosting circuit according to claim 4,
    wherein said first and second boosting stages receive a first signal,
    and wherein when said first signal takes a first logical value, said first and second boosting stages apply a ground potential to first ends of said plurality of capacitors or to a first end of said capacitor and apply said power-supply voltage to second ends of said plurality of capacitors or to a second end of said capacitor, so as to charge said plurality of capacitors or said capacitor, and
    when said first signal takes a second logical value which differs from said first logical value, said first and second boosting stages boost the potential at said first ends of said plurality of capacitors or at said first end of said capacitor from said ground potential while keeping the potential at said second ends of said plurality of capacitors or at said second end of said capacitor in a floating state.

6. The boosting circuit according to claim 1,
    wherein said detecting portion compares a divided voltage value obtained by resistor-dividing said power-supply voltage with a given voltage value and determines how many of said plurality of capacitors should be parallel-connected on the basis of the comparison.

7. The boosting circuit according to claim 1, which is used as a word line boosting circuit in a semiconductor storage device comprising a semiconductor non-volatile memory element, a word line connected to said semiconductor non-volatile memory element, and said word line boosting circuit for reading the contents stored in said semiconductor non-volatile memory element through said word line.

8. A boosting circuit comprising:
    a detecting portion for detecting the value of a power-supply voltage;

a plurality of boosting stages each comprising a capacitor, for boosting said power-supply voltage by using said capacitor,
wherein said plurality of boosting stages are connected in series, and
said detecting portion determines which output of said plurality of boosting stages should be used in accordance with the detected value of said power-supply voltage; and
a transistor having first and second current electrodes and a control electrode,
wherein an output of said boosting stage is applied to said control electrode of said transistor.

9. The boosting circuit according to claim 8,
wherein said boosting stages receive a first signal,
and wherein when said first signal takes a first logical value, each said boosting stage applies a ground potential to a first end of said capacitor and applies said power-supply voltage to a second end of said capacitor, so as to charge said capacitor, and
when said first signal takes a second logical value which differs from said first logical value, each said boosting stage boosts the potential at said first end of said capacitor from said ground potential while keeping the potential at said second end of said capacitor in a floating state.

10. The boosting circuit according to claim 8,
wherein said detecting portion compares a divided voltage value obtained by resistor-dividing said power-supply voltage with a given voltage value and determines which output of said plurality of boosting stages should be used on the basis of the comparison.

11. The boosting circuit according to claim 8, which is used as a word line boosting circuit in a semiconductor storage device comprising a semiconductor non-volatile memory element, a word line connected to said semiconductor non-volatile memory element, and said word line boosting circuit for reading the contents stored in said semiconductor non-volatile memory element through said word line.

12. A boosting circuit comprising:
a detecting portion for detecting the value of a power-supply voltage;
a transistor having first and second current electrodes and a control electrode; and
first and second boosting stages each comprising a capacitor, for boosting said power-supply voltage by using said capacitor,
wherein an output of said first boosting stage is applied to said first current electrode of said transistor,
wherein an output of said second boosting stage is applied to said control electrode of said transistor, and
said detecting portion varies the amount of boost in said first or second boosting stage in accordance with the detected value of said power-supply voltage.

13. The boosting circuit according to claim 12,
wherein said first and second boosting stages receive a first and a second signals respectively,
and wherein when respective said first and second signals take a first logical value, said respective first and second boosting stages apply a ground potential to a first end of said capacitor and apply said power-supply voltage to a second end of said capacitor, so as to charge said capacitor, and
when respective said first and second signals take a second logical value which differs from said first logical value, said respective first and second boosting stages boost the potential at said first end of said capacitor from said ground potential while keeping the potential at said second end of said capacitor in a floating state.

14. The boosting circuit according to claim 12,
wherein said detecting portion compares a divided voltage value obtained by resistor-dividing said power-supply voltage with a given voltage value and determines said amount of boost in said first or second boosting stage on the basis of the comparison.

15. The boosting circuit according to claim 12, which is used as a word line boosting circuit in a semiconductor storage device comprising a semiconductor non-volatile memory element, a word line connected to said semiconductor non-volatile memory element, and said word line boosting circuit for reading the contents stored in said semiconductor non-volatile memory element through said word line.

16. A boosting circuit comprising:
a detecting portion arranged to detect the value of a power-supply voltage;
a first boosting stage comprising a plurality of boosting stages, each of said plurality of boosting stages comprises a first capacitor and is arranged to boost said power-supply voltage using said first capacitor, said plurality of boosting stages are connected in series;
a second boosting stage comprising a second capacitor and boosting said power-supply voltage using said second capacitor; and
a transistor comprising first and second current electrodes and a control electrode, wherein
said detecting portion is arranged to determine which outputs from said plurality of boosting stages to be used in accordance with the detected value of said power-supply voltage,
said first current electrode of said transistor is supplied with said power-supply voltage which is boosted in said first boosting stage, and
said second current electrode of said transistor is supplied with said power-supply voltage which is boosted in said second boosting stage.

17. The boosting circuit according to claim 16,
wherein said plurality of boosting stage are arranged to receive a first signal,
and wherein when said first signal takes a first logical value, each of said plurality of boosting stages applies a ground potential to a first end of said first capacitor, and applies said power-supply voltage to a second end of said capacitor so as to charge said first capacitor, and
when said first signal takes a second logical value which differs from said first logical value, each of said plurality of boosting stages boosts the potential at said first end of said first capacitor from said ground potential while keeping the potential at said second end of said first capacitor in a floating state.

18. The boosting circuit according to claim 16,
wherein said detecting portion compares a divided voltage value obtained by resistor-dividing said power supply voltage with a given voltage value and determines which output of said plurality of boosting stages should be used on the basis of the comparison.

* * * * *